United States Patent [19]
Meguro et al.

[11] Patent Number: 5,700,705
[45] Date of Patent: Dec. 23, 1997

[54] SEMICONDUCTOR INTEGRATED CIRCUIT DEVICE

[75] Inventors: Satoshi Meguro, Hinode-machi; Kiyofumi Uchibori, Katakura-machi; Norio Suzuki, Koganei; Makoto Motoyoshi, Hachioji; Atsuyoshi Koike, Kokubunji; Toshiaki Yamanaka, Houya; Yoshio Sakai, Shiroyama-machi; Toru Kaga, Urawa; Naotaka Hashimoto; Takashi Hashimoto, both of Hachioji; Shigeru Honjou, Gakuennishi-machi; Osamu Minato, Hinode-machi, all of Japan

[73] Assignee: Hitachi, Ltd., Tokyo, Japan

[21] Appl. No.: 470,452

[22] Filed: Jun. 6, 1995

Related U.S. Application Data

[62] Division of Ser. No. 28,128, Mar. 9, 1993, Pat. No. 5,483,083, which is a division of Ser. No. 837,689, Feb. 19, 1992, Pat. No. 5,194,749, which is a continuation of Ser. No. 625,682, Dec. 12, 1990, abandoned, which is a continuation of Ser. No. 274,490, Nov. 22, 1988, abandoned.

[30] Foreign Application Priority Data

Nov. 30, 1987 [JP] Japan ................... 62-305465
Dec. 23, 1987 [JP] Japan ................... 62-324094
Feb. 9, 1988 [JP] Japan ................... 63-26641

[51] Int. Cl.⁶ ........................... H01L 21/8244
[52] U.S. Cl. ............... 437/52; 437/48; 437/56; 437/915
[58] Field of Search ................ 437/DIG. 915, 437/52, 56, 48

[56] References Cited

U.S. PATENT DOCUMENTS 4,476,475 10/1984 Naem et al. ................ 357/23.7
4,555,721 11/1985 Bansal et al. ............... 357/42

(List continued on next page.)

FOREIGN PATENT DOCUMENTS 57-018369 1/1982 Japan ..................... 357/23.5

(List continued on next page.)

OTHER PUBLICATIONS

IEEE Transactions on Electron Devices, vol. ED-32, No. 2, Feb. 1983, pp. 273–277.

(List continued on next page.)

*Primary Examiner*—Charles L. Bowers, Jr.
*Assistant Examiner*—Toniae M. Thomas
*Attorney, Agent, or Firm*—Antonelli, Terry, Stout & Kraus, LLP

[57] ABSTRACT

The manufacture of a memory cell of the type employing a pair of cross-coupled CMOS inverters of a SRAM is disclosed in which the load MISFETs are stacked above the semiconductor substrate and over the drive MISFETs. The manufacture of each load MISFET consists of forming source, drain and channel regions within the same polycrystalline silicon film, and a gate electrode consisting of a different layer conductive film, such as a polycrystalline film, than that of the drive MISFETs. The manufacture of the memory cell having such a stacked arrangement, facilitates the patterning of the source (drain) region and gate electrode of each load MISFET thereof to have an overlapping relationship with each other so as to increase the effective capacitance associated with each of the memory cell storage nodes. The gate electrodes of both the drive and load MISFETs are formed of n-type or of n-type and p-type polycrystalline silicon films, respectively, and electrical connections are formed between the drain regions of the first and second p-channel load MISFETs with that of the drain regions of the first and second n-channel drive MISFETs through separate polycrystalline silicon films, respectively. Also, there are formed electrical connections between the polycrystalline silicon gate electrodes of the first and second load MISFETs with that of drain regions of the second and first drive MISFETs, through the poly-Si gate electrodes of the first and second drive MISFETs, in each memory cell of the SRAM, respectively, furthermore.

31 Claims, 17 Drawing Sheets

U.S. PATENT DOCUMENTS

| | | | |
|---|---|---|---|
| 4,571,609 | 2/1986 | Hatano | 357/59 E |
| 4,653,025 | 3/1987 | Minato et al. | 257/69 |
| 4,656,731 | 4/1987 | Lam et al. | 357/23.7 |
| 4,698,787 | 10/1987 | Mukherjee et al. | 357/23.5 |
| 4,774,203 | 9/1988 | Ikeda et al. | 357/59 |
| 4,794,561 | 12/1988 | Hsu | 357/23.6 |
| 4,803,534 | 2/1989 | Koike et al. | 357/23.5 |
| 4,804,637 | 2/1989 | Smayling et al. | 357/23.5 |
| 4,841,481 | 6/1989 | Ikeda et al. | 357/23.5 |
| 4,890,148 | 12/1989 | Ikeda et al. | 357/23.5 |
| 4,894,801 | 1/1990 | Saito et al. | 365/154 |
| 5,194,749 | 3/1993 | Meguro et al. | 257/69 |

FOREIGN PATENT DOCUMENTS

| | | | |
|---|---|---|---|
| 57-043455 | 3/1982 | Japan | 357/42 |
| 57-204171 | 12/1982 | Japan | 357/23.7 |
| 59-082770 | 5/1984 | Japan | 357/23.5 |
| 61-139067 | 6/1986 | Japan | 357/23.1 |
| 61-144878 | 7/1986 | Japan | 357/23.5 |
| 1161860 | 6/1989 | Japan | 357/51 |
| 2141871 | 1/1985 | United Kingdom | 357/235 |

OTHER PUBLICATIONS

Charles Cohen, 3–d IC May Augur Denser VLSI Circuitry; Multiple Layers Are a Possibility; Sep. 22, 1983, p. 92, Electronics International.

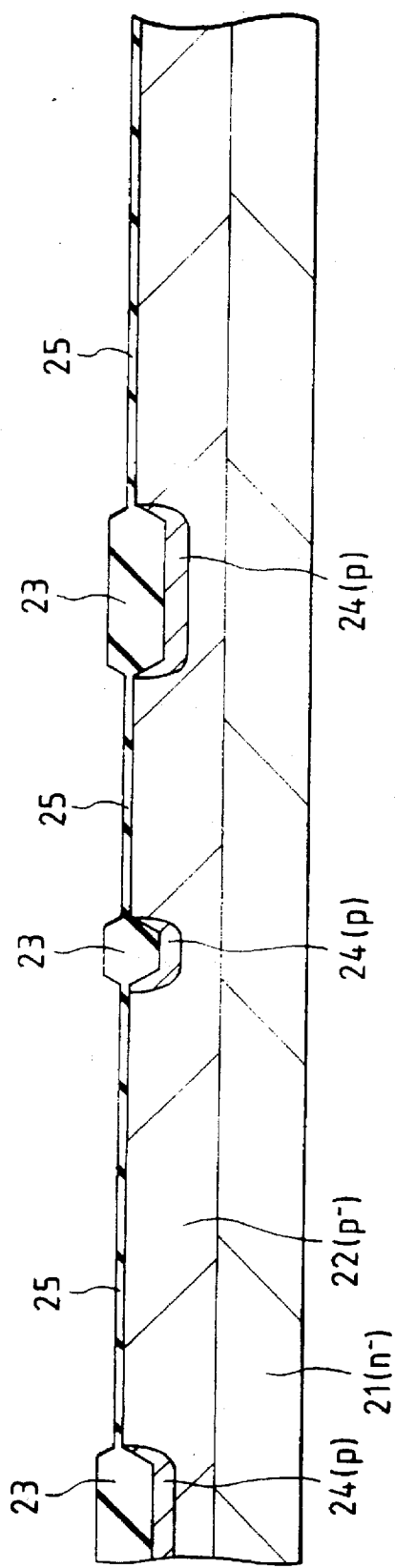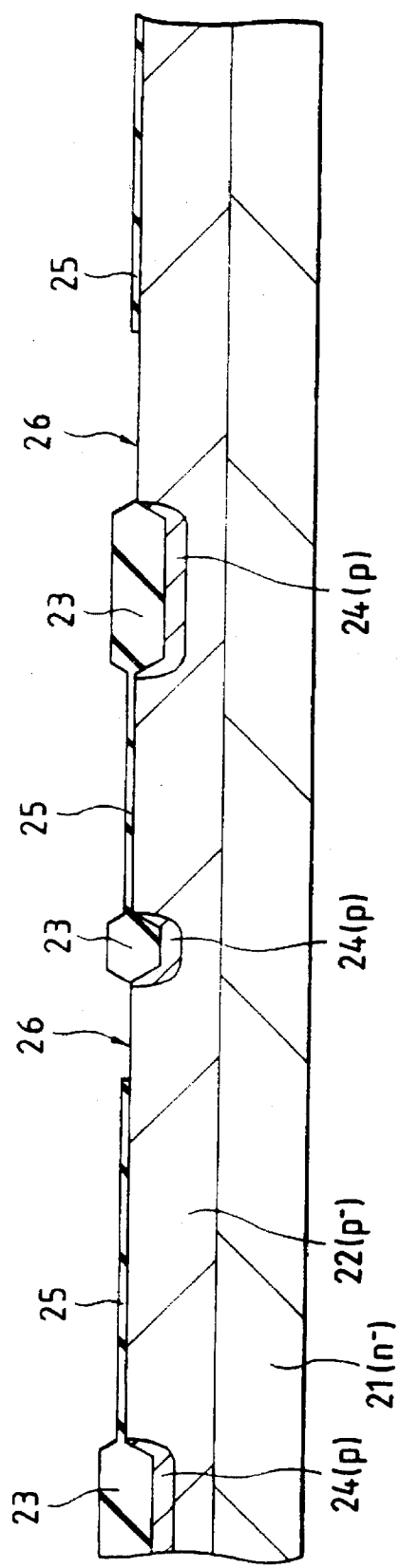

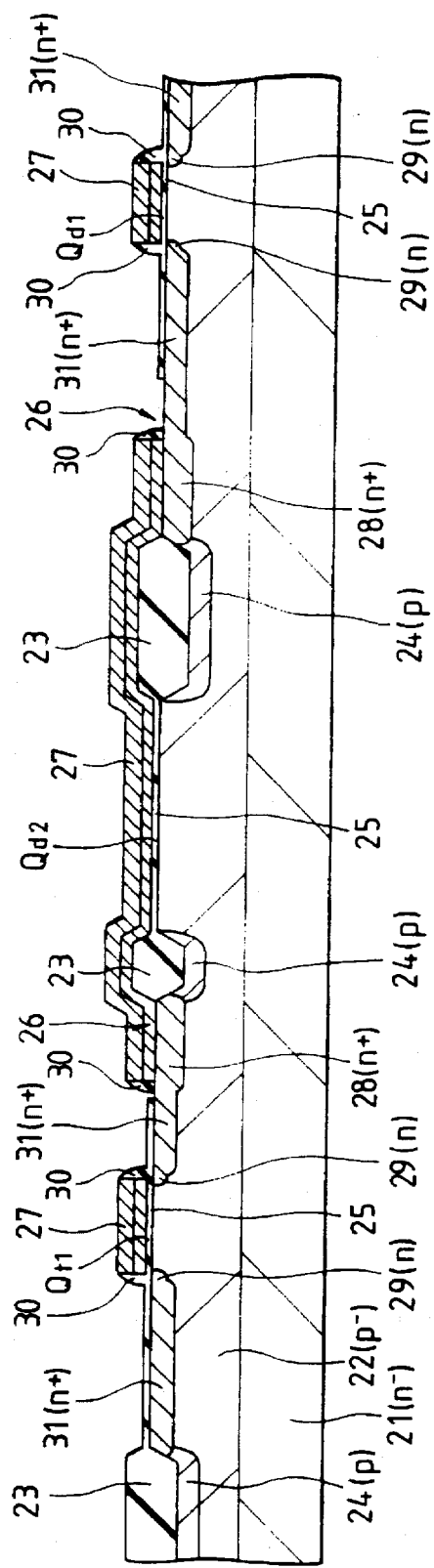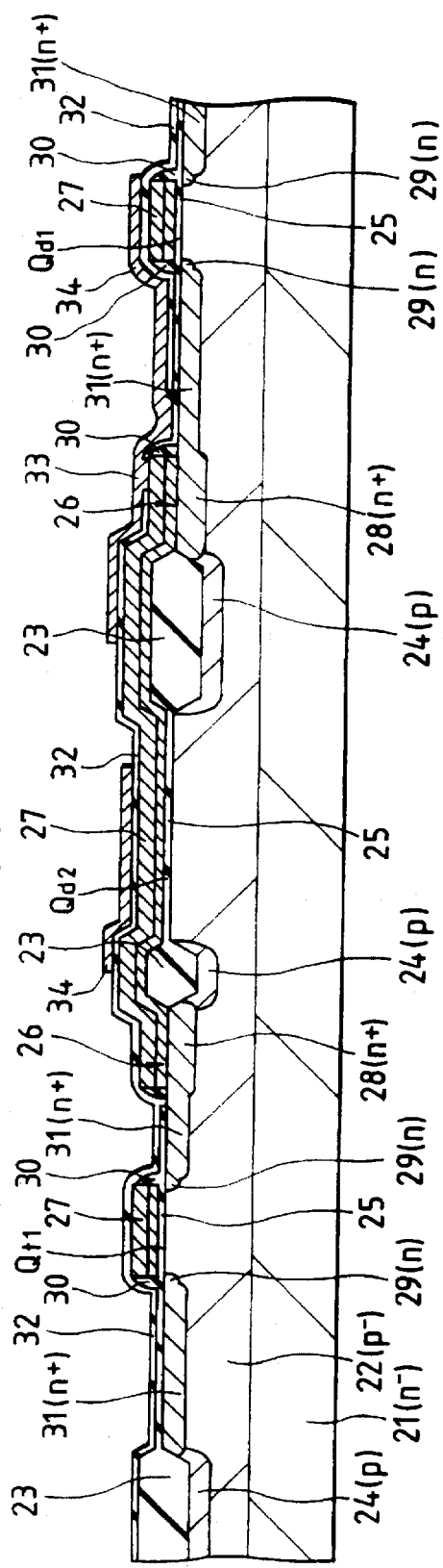

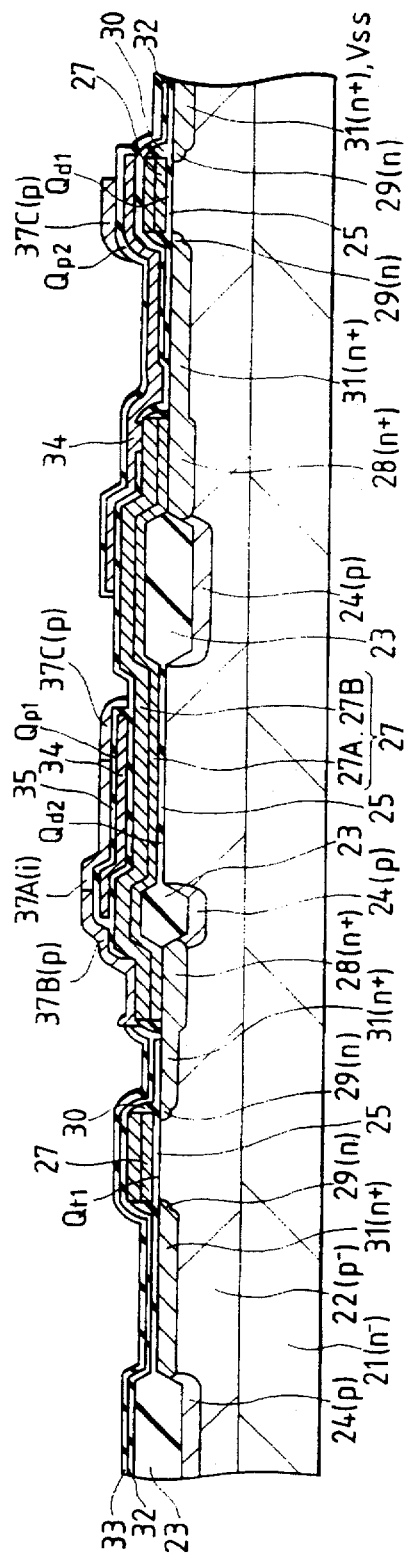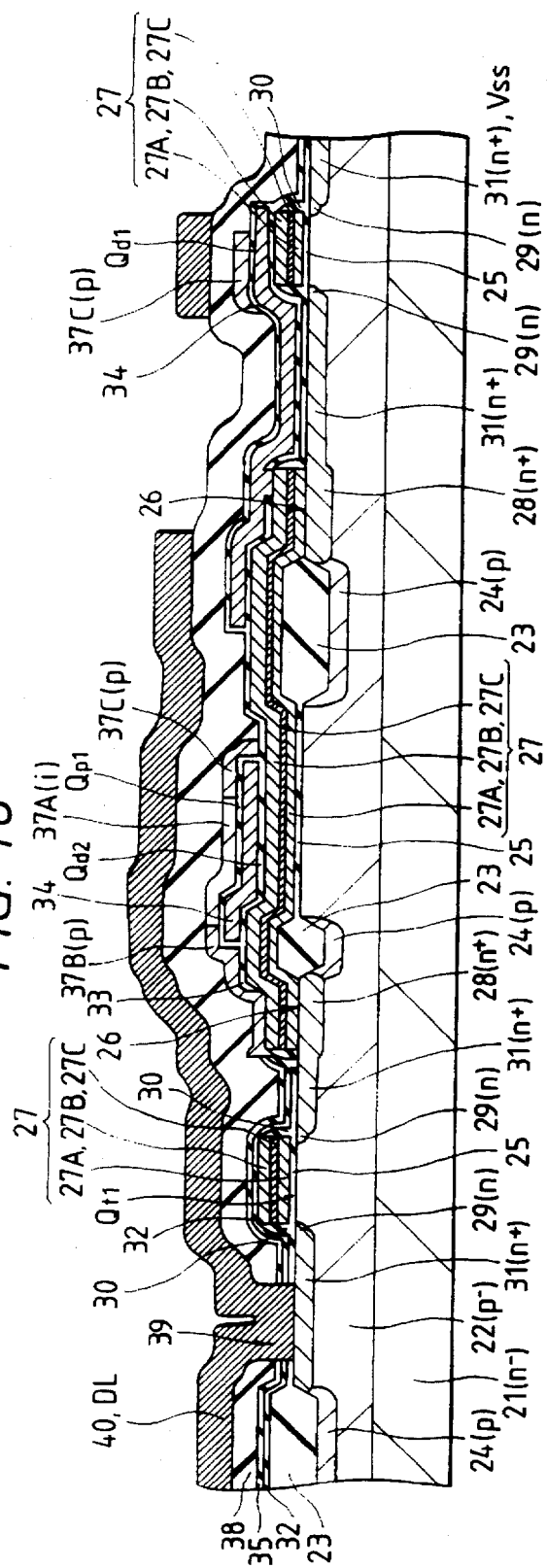

5,700,705

SEMICONDUCTOR INTEGRATED CIRCUIT DEVICE

This is a divisional of application Ser. No. 08/028,128 filed Mar. 9, 1995; now U.S. Pat. No. 5,483,043, which is a divisional of application Ser. No. 07/837,689 filed Feb. 19, 1992, now U.S. Pat. No. 5,194,749; which is a continuation of application Ser. No. 07/625,682 filed Dec. 12, 1990, now abandoned; and which, in turn, is a continuation of application Ser. No. 07/274,490 filed Nov. 22, 1988, now abandoned.

BACKGROUND OF THE INVENTION

The present invention relates to a semiconductor integrated circuit device and, more particularly, to effective technology to be applied to a semiconductor integrated circuit device having a SRAM (static random access memory) constituted by a memory cell CMOS type.

A SRAM memory cell of the CMOS type is composed of a flip-flop circuit comprising a pair of cross-connected (cross-coupled) CMOS inverter circuits each of which consisting of a series connection of an n-channel drive MISFET and a p-channel load MISFET, and a pair of n-channel transfer MISFETs each of which connecting a storage node of the flip-flop circuit to one of a pair of complementary data lines. The flip-flop circuit is supplied with the power source voltage Vcc and the ground potential, and a pair of data lines are respectively connected to the drain of the transfer MOSFETs wherein the common gate thereof becomes a word line. Operation of such memory cell of a known SRAM is effected in that the word line is raised and information (data) of "High" or "Low" from the data line is stored through the transfer MISFET to the storage node during the writing of data, or information stored in the storage node is read through the transfer MISFET during the reading of data, thereby the memory cell functions as a static memory. In such a SRAM memory cell of the CMOS circuit, since leakage current of the MISFET only flows through the memory cell at the waiting state, the consumption power is quite low.

In the SRAM memory cell of the CMOS type, however, since one memory cell is constituted by a total of six MISFETs, a problem occurs in that the chip size becomes large. An attempt to solve such problems is discussed in connection with a memory cell called "Stacked CMOS" described in IEEE TRANSACTIONS ON ELECTRON DEVICES, vol. ED-32, No. 2, FEBRUARY 1985, p. 273–277. The memory cell called "Stacked CMOS" is constituted by p-channel load MISFET of a flip-flop circuit formed to a polysilicon film on n-channel drive MISFET. Further describing the memory cell using FIGS. 1 and 2, n-channel drive MISFET formed in a silicon substrate is converted at an upper portion and a side surface of a gate electrode $3b$ by at least a thin insulation film 14, and further a polysilicon film is provided on an upper portion and a side surface thereof. Source $5e$, drain $5b$ and a channel member $5d$ of p-channel load MISFET are formed in the polysilicon film. Gate electrode of the p-channel load MISFET is common to the gate electrode $3b$ of the n-channel drive MISFET just below the channel member $5d$, and a thin insulation film 14 becomes a gate insulation film of the p-channel MISFET. The drive MISFET of the flip-flop circuit is constituted by n-type impurity area $1e$ forming the common source, n-type impurity areas $1c$, $1d$ forming drain and gate electrodes $3b$, $3c$. Respective gate electrodes $3b$, $3c$ are connected through connection holes $2b$, $2a$ to impurity areas at drain side in cross connection. N-type impurity areas $1c$, $1d$ forming drain of respective drive MISFETs are common to source of the n-channel transfer MISFET connected to the flip-flop circuit and constitute storage node of the flip-flop circuit, and the transfer MISFET is constituted by a gate electrode $3a$ common to the source impurity area and n-type impurity areas $1a$, $1b$ forming drain. The n-type impurity areas $1a$, $1b$ are connected through connection holes $8a$, $8b$ to aluminium electrodes $9a$, $9b$. The common gate electrode $3a$ constitutes a word line in the memory, and the aluminium electrodes $9a$, $9b$ constitute data lines, respectively. On low-resistance polysilicon films $5a$, $5b$ where the p-type impurity forming drain of the p-channel load MISFET is added at high density and gate electrodes $3b$, $3c$ of the drive MISFET, connection holes $8e$, $8f$ are opened so that respective active areas are exposed commonly. Aluminium electrodes $9c$, $9d$ connect between the polysilicon film $5a$ and the gate electrode $3b$ and between the polysilicon film $5b$ and the gate electrode $3c$, respectively. The source of the p-channel load MISFET comprises a common low resistance polysilicon film $5e$ to which a p-type impurity is added at high density, and the power source voltage Vcc is supplied to the source of the two p-channel MISFETs. Channel members $5c$, $5d$ of the p-channel MISFETs are arranged on the gate electrodes $3c$, $3d$ of the drive MISFET, respectively.

SUMMARY OF THE INVENTION

In their investigation, the inventors have found the above-mentioned memory cell has the following problems.

First, since the gate electrode of the n-channel drive MISFET formed in the silicon substrate and the gate electrode of the p-channel load MISFET in stacked state are common, the channel member of the p-channel load MISFET must be always arranged on the gate electrode of the drive MISFET. Consequently, degree of freedom becomes small in the case of the layout of the memory cell, thereby the area of the memory cell cannot be decreased efficiently.

Further, in order to form a thin insulation film on the gate electrode of the drive MISFET, material of the gate electrode may be limited. It is difficult to form a thin insulation film on a surface of a high melting-point metal such as tungsten or molybdenum which is required to accelerate the operation speed of the memory or on a surface of a silicide thereof, thereby such low resistance material cannot be used actually.

Also it has been reported until now that the drive capacity of the p-channel MISFET which is formed in a stacked state is small in comparison to that of the p-channel MISFET formed in the silicon substrate. For example, mobility of hole in the p-channel MISFET using the polysilicon is about 10 cm$^2$/V S. In the static memory having a load MISFET of such low drive capacity, the following problems arise. If α-rays, generated during the decay of uranium (U) or thorium (Th), included in a small quantity in material, such as resin, to be used in the sealing of the memory chip or in a wiring material, such as aluminium, are incident to the storage node portion in the "High" state within the memory cell, electron—positive hole pairs are generated along the range of α-rays and attracted by the electric field of the depletion layer so as to vary the potential of the storage node. As a result, if the potential variation has sufficient value to invert the flip-flop, information of the memory is destroyed. This is a phenomenon called soft error. In the memory cell of a SRAM of the CMOS type, in the prior art, where all MISFETs are formed in the silicon substrate, mobility of a hole indicating the drive capacity of the p-channel load MISFET is 200 cm²/VS or more thereby current can be supplied to the storage node following the potential variation Of the storage node. In the memory cell of SRAM using the p-channel MISFET in stacked state, however, since the current drive capacity is small as above described, sufficient current cannot be supplied to the storage node before the information is destroyed because of the potential variation of the storage node.

Also charge of some degree is stored in the storage node portion due to capacitance of P-N junction formed in drain portion of the drive MISFET or gate capacitance, and there is no problem if the potential variation of the storage node can be restored by supply of this charge. In the memory cell in the high integrated state, however, since the area of the cell is small and therefore capacitance of the above-mentioned P-N junction or the gate capacitance is also small, the stored charge is small and further the current drive capacity of the p-channel MISFET is small, thereby sufficient charge cannot be supplied to the storage node. As a result, information of the memory cell is destroyed.

An object of the invention is to provide a SRAM having memory cell structure wherein degree of freedom in the case of the layout of the memory cell is large.

Another object of the invention is to provide a SRAM to enable the high speed operation.

Another object of the invention is to provide a SRAM having a memory cell which is resistant to soft error.

Accordingly, outline of typical improved aspects of the invention disclosed in the present application will be briefly described as follows:

A memory cell of SRAM of CMOS type has structure such that a load MISFET has a gate electrode which is formed separately from a gate electrode of a drive MISFET and is disposed on an upper side (above) of the drive MISFET.

A memory cell of SRAM of CMOS type has structure such that a gate electrode of a drive MISFET and a gate electrode of a transfer MISFET, which is formed simultaneously to the drive MISFET, have a silicide layer.

A memory cell of SRAM of CMOS type has structure such that a gate electrode of a load MISFET which is formed on the upper side of (or above) a drive MISFET is overlapped with the source—drain area thereof thereby capacitance of a holding node is equivalently made large.

A memory cell of a SRAM of the CMOS type has a structure such that a load MISFET Is formed on an upper side of (or above) a gate electrode of the drive MISFET thereof through an insulation film, wherein the load MISFET thereof has a gate electrode at lower side, and a channel area and source—drain area positioned insulatedly on upper side of the gate electrode, thereby capacitance of a holding (storage) node is equivalently made large.

BRIEF DESCRIPTION OF THE DRAWINGS

FIGS. 9 through 15 are main part sectional views of the memory cell in each manufacturing process;

FIG. 16 is a sectional view illustrating a first modification of the invention;

DESCRIPTION OF THE PREFERRED EMBODIMENTS

Figure 5:
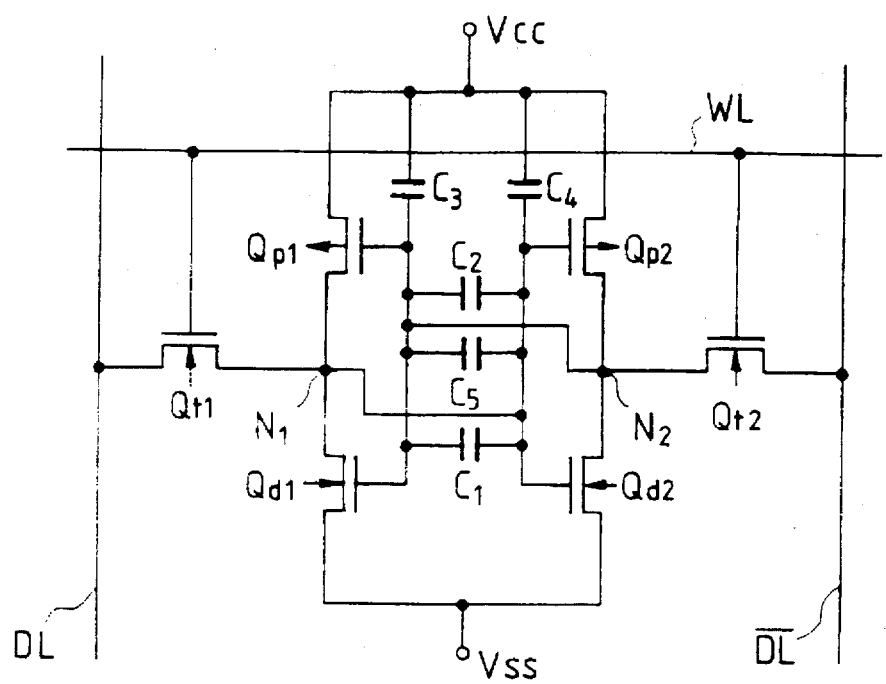
FIG. 5 is an equivalent circuit diagram of the memory cell.

A memory cell of a SRAM as embodiment 1 of the present invention is shown in an equivalent circuit diagram of FIG. 5.

As shown in FIG. 5, the memory cell of SRAM is arranged at intersecting portion of complementary data lines DL, DL and a word line WL. The complementary data line DL extends in the column direction, and the word line WL extends in the row direction.

The memory cell is composed of a flip-flop circuit and two transfer MISFETs Qt1 and Qt2 with one semiconductor area (region) thereof connected to a pair of input/output terminals of the flip-flop circuit, respectively.

The transfer MISFETs Qt1, Qt2 are constituted by n-channel type, respectively. The other semiconductor area (region) of the transfer MISFETs Qt1, Qt2 is connected to the complementary data line DL, respectively. Each gate electrode of the transfer MISFETs Qt1, Qt2 is connected to the word line WL.

The flip-flop circuit is constituted as an information storage member (having information storage node portion). The flip-flop circuit is composed of two drive MISFETs Qd1 and Qd2 and two load MISFETs Qp1 and Qp2. The drive MISFETs Qd1 and Qd2 are constituted by n-channel type, and the load MISFETs Qp1 and Qp2 are constituted by p-channel type. That is, the flip-flop circuit is constituted by complete CMOS.

Respective source areas (regions) of the drive MISFETs Qd1, Qd2 are connected to the reference voltage Vss. The reference voltage is the ground potential 0 (V) of the circuit, for example. Drain area (region) of the drive MISFET Qd1 is connected to the drain area (region) of the load MISFET Qp1, one semiconductor area (region) of the transfer MISFET Qt1, gate electrode of the drive MISFET Qd2 and gate electrode of the load MISFET Qp2. Drain area (region) of the drive MISFET Qd2 is connected to the drain area (region) of the load MISFET Qp2, one semiconductor area (region) of the transfer MISFET Qt2, gate electrode of the drive MISFET Qd1 and gate electrode of the load MISFET Qp1. Respective source areas (regions) of the load MISFETs Qp1, Qp2 are connected to the power source voltage Vcc. The power source voltage Vcc is the operation voltage 5 (V) of the circuit, for example.

Figure 1:
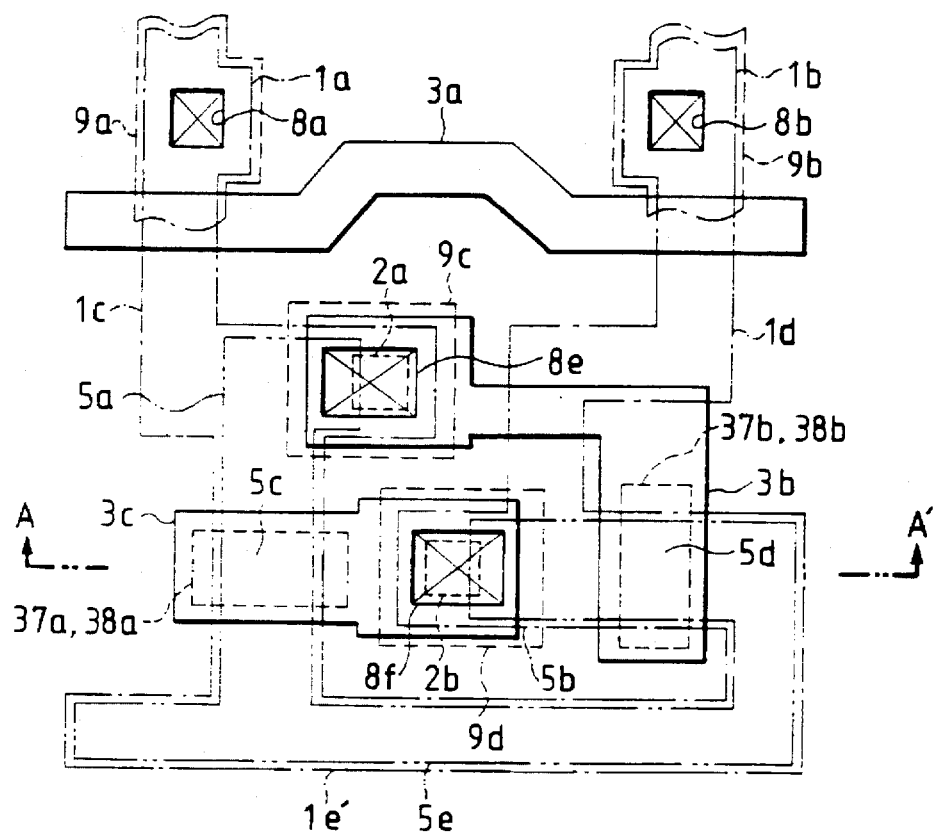
FIGS. 1 and 2 are a layout diagram and a main part sectional view of a SRAM memory cell in the prior art.
Figure 2:
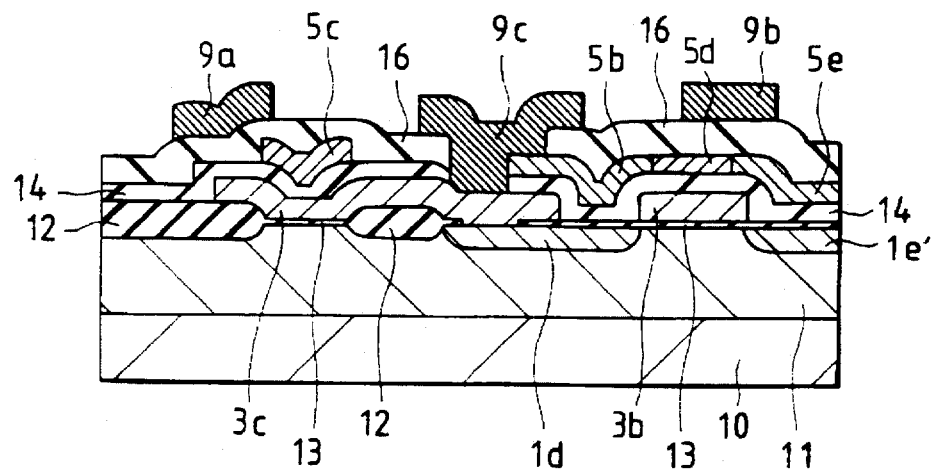
Figure 3:
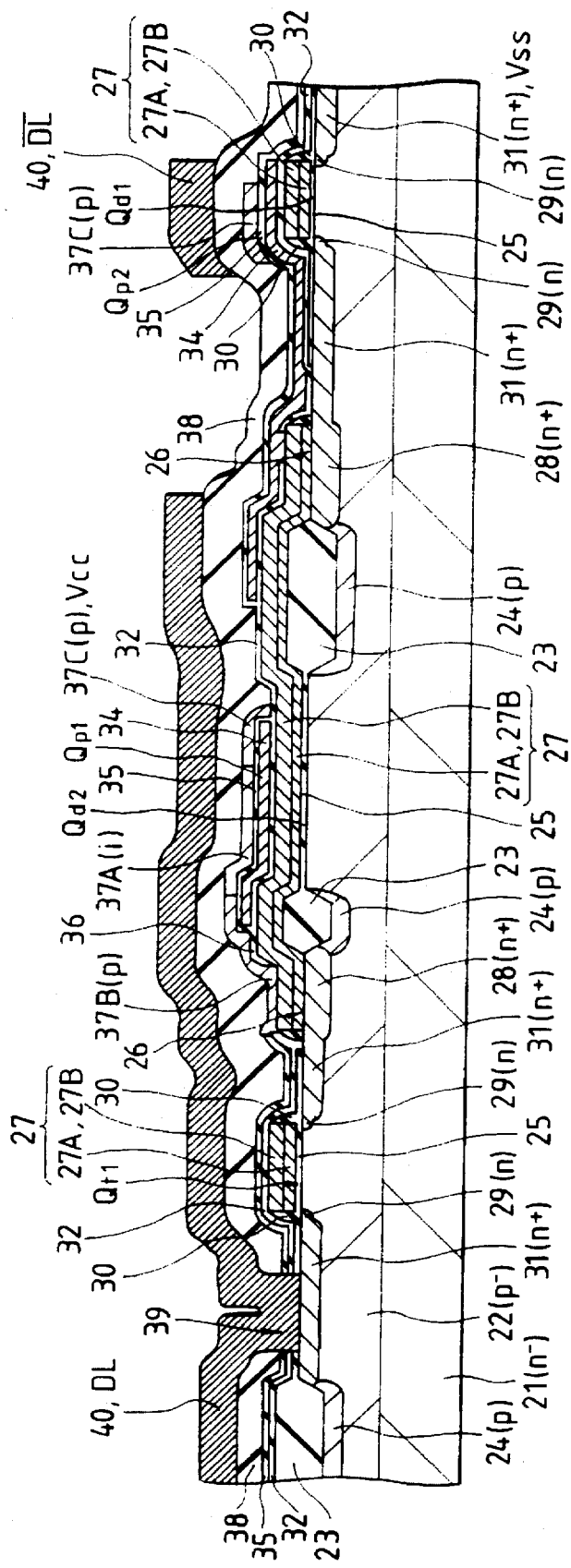
FIG. 3 is a main part sectional view of a SRAM memory cell of the invention.
Figure 4:
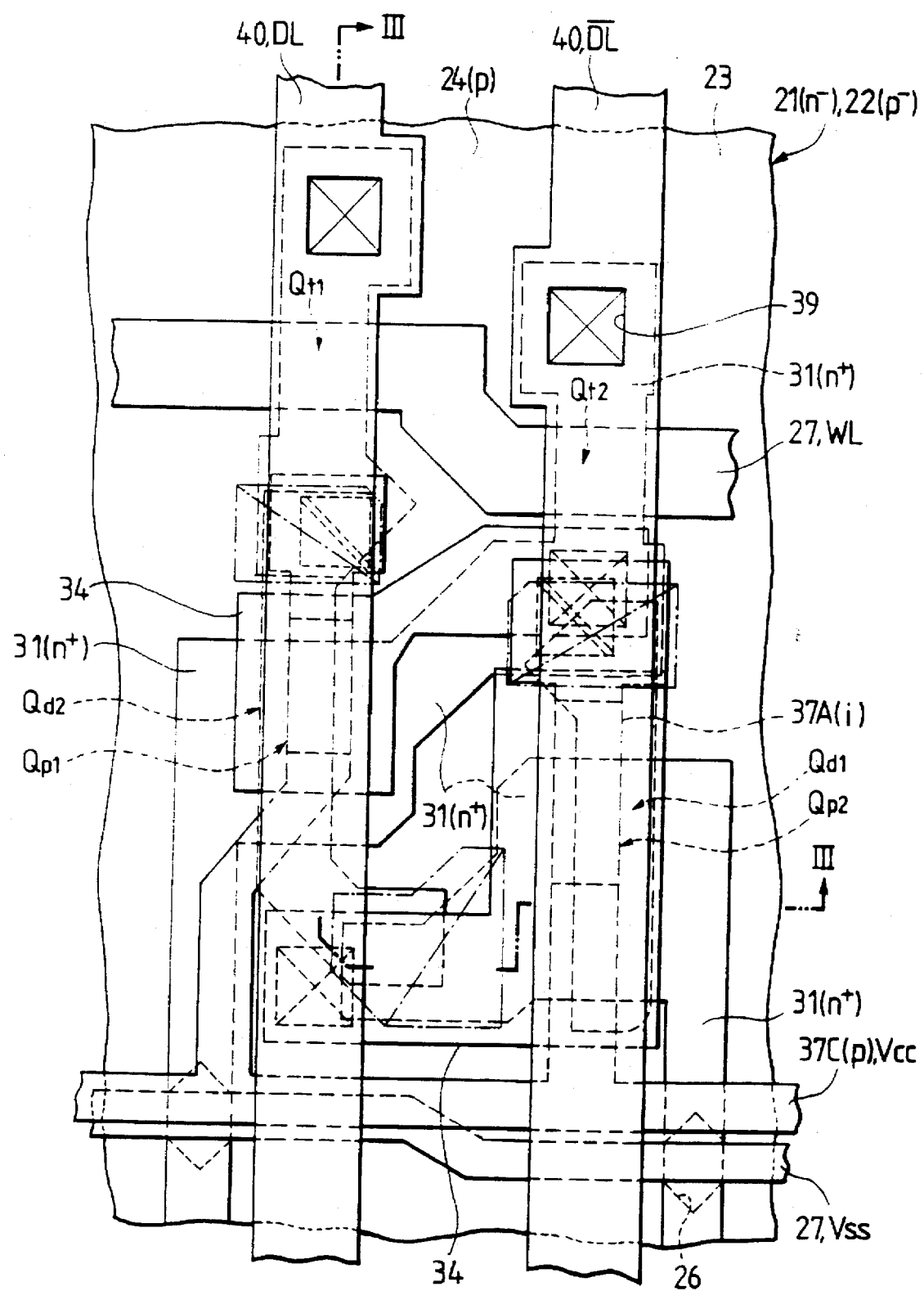
FIG. 4 is a plan view of the memory cell.

Next, specific structure of the memory cell of SRAM constituted as above described will be briefly described referring to FIG. 4 (plan view) and FIG. 3 (sectional view taken in cutting line III—III of FIG. 4).

The memory cell, as shown in FIGS. 3 and 4, is provided on a main surface portion of p⁻type well area 22 formed on a main surface portion of n⁻type semiconductor substrate 21 of monocrystalline silicon. Although not shown, in an area other than the p⁻type well area 22, n⁻type well area is provided on main surface portion of the semiconductor substrate 21. Between memory cells or between elements each constituting a memory cell, a field insulation film 23 and p type channel stopper area 24 are provided on main surface of the well area 22. The field insulation film 23 and the channel stopper area 24 are constituted respectively so as to effect electrical isolation between memory cells or between elements each constituting a memory cell.

Figure 6:
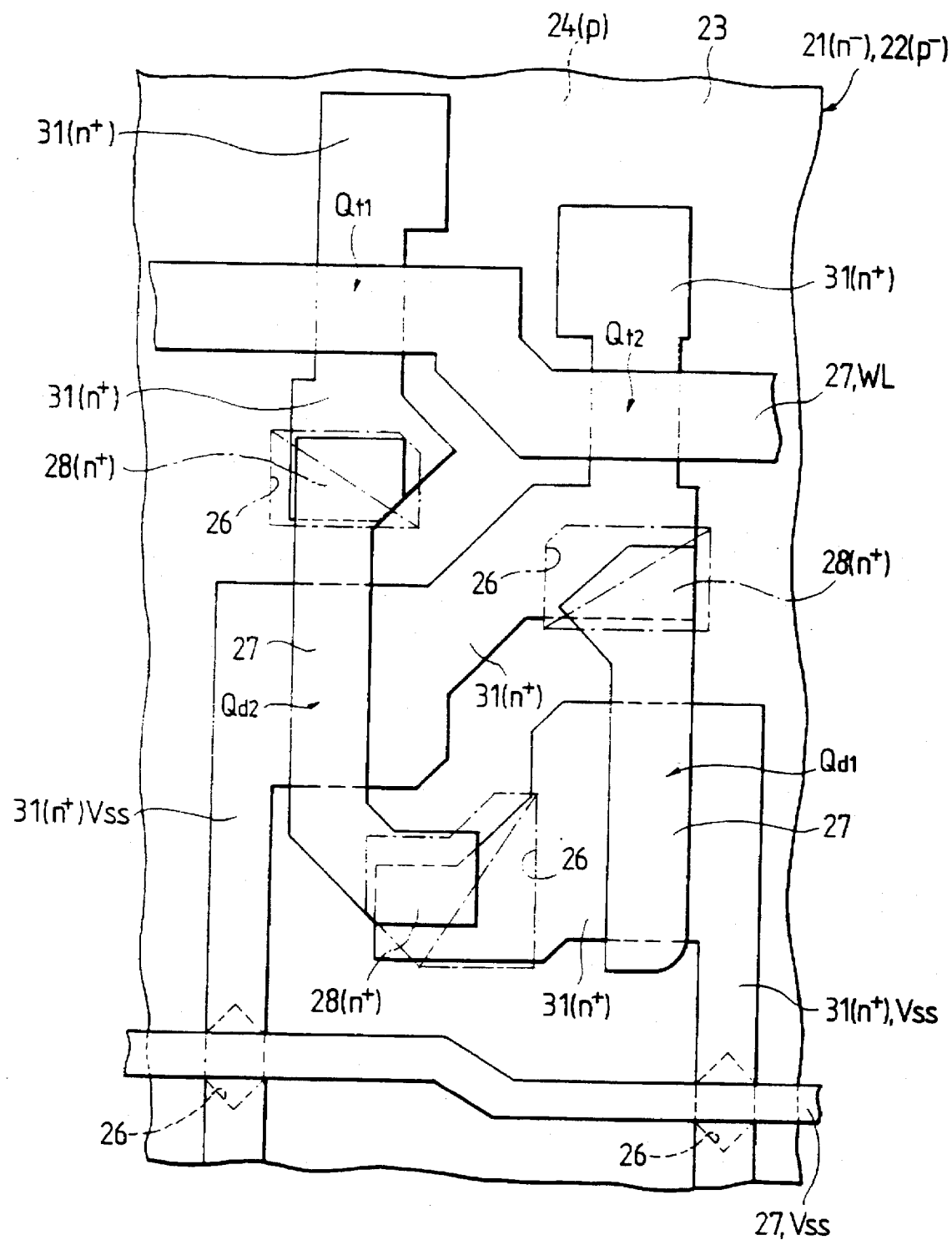
FIGS. 6 through 8 are plan views of the memory cell in the prescribed manufacturing processes.

The transfer MISFETs Qt1, Qt2 of the memory cell respectively, as shown in FIGS. 3, 4 and 6 (plan view in the prescribed manufacturing process), are formed on a main surface of the well area 22 in an area surrounded by the field insulation film 23 and the channel stopper area 24. That is, the transfer MISFETs Qt1, Qt2 respectively are mainly composed of the well area 22, a gate insulation film 25, a gate electrode 27, a pair of n type semiconductor areas 29 being source area and drain area, and a pair of n⁺type semiconductor areas (regions) 31.

The well area 22 is used as a channel forming area (region).

The gate insulation film 25 is constituted by a silicon oxide film formed by oxidizing the main surface of the well area 22.

The gate electrode 27 of both the transfer MISFETs Qt1, Qt2 and that of the drive MISFETs Qd1, Qd2 is constituted in the same layer according to a prescribed upper portion of the gate insulation film 20. The gate electrode 27 is constituted by a composite film comprising a polycrystalline silicon film 27A and a high melting-point metal silicide film (WSi$_2$) 27B stacked on upper side of the silicon film 27A. The polycrystalline silicon film 27A is deposited by means of CVD, and n type impurity (P or As) to reduce the resistance value is introduced therein. The high melting-point metal silicide film 27B is deposited by means of sputtering or CVD. The gate electrode 27 constituted by the composite film has specific resistance value being small in comparison to that of a single layer of the polycrystalline silicon film thereby the operation speed can be made high. Since the gate electrode of the transfer MISFETs Qt1, Qt2 is formed simultaneously with the gate electrode of the drive MISFETs Qd1, Qd2, i.e., the word line is formed using the high melting-point metal silicide film having small resistance value, high speed of read/write operation of information can be realized. Also since the gate electrode 27 has the upper layer constituted by the high melting-point metal silicide film 27B, irrespective of the conductivity type of the impurity introduced in the polycrystalline silicon film (34 and 37) of the upper layer of the gate electrode 27, the ohmic connection can be effected in connection to the polycrystalline silicon film of the upper layer.

Respective gate electrodes 27 of the transfer MISFETs Qt1, Qt2 are constituted integrally with the word line (WL) 27 extending in the row direction. The word line 27 is provided on the field insulation film 23.

The gate electrode 27 may be constituted by a composite film comprising the polycrystalline silicon film 27A and a high melting-point metal silicide film other than the above (MoSi$_2$, TaSi$_2$, TiSi$_2$) or a high melting-point metal film (Mo, Ta, Ti, W) stacked on the silicon film 27A. Also the gate electrode 27 may be constituted by a single layer of the polycrystalline silicon film, the high melting-point metal film or the high melting-point metal silicide film.

A semiconductor area 29 of low impurity density is constituted integrally with a semiconductor area 31 of high impurity density, and provided at a side of the channel forming area in the main surface portion of the well area 22. The semiconductor area 29 of low impurity density constitutes the transfer MISFETs Qt1, Qt2 respectively in so-called LDD (Lightly Doped Drain) structure. The semiconductor area 29 of low impurity density is constituted in self-alignment to the gate electrode 27.

The semiconductor area 31 of high impurity density is constituted in self-alignment to a side wall spacer 30 formed on a side wall of the gate electrode 27.

The drive MISFETs Qd1, Qd2 of the memory cell respectively are formed in substantially the same manner as that of the transfer MISFETs Qt1, Qt2 respectively. That is, the drive MISFETs Qd1, Qd2 respectively are composed of the well area 22, the gate insulation film 25, the gate electrode 27, a pair of n type semiconductor areas 29 being source area and drain area, and a pair of n⁺type semiconductor areas 31. The drive MISFETs Qd1, Qd2 respectively are constituted by the LDD structure.

One extending end of the gate electrode 27 of the drive MISFET Qd2 passes through a connection hole 26, and is connected to one semiconductor area 31 of the transfer MISFET Qt1 through the n⁺type semiconductor area 28 interposed therein. Also one extending end of the gate electrode 27 of the drive MISFET Qd1 passes through the connection hole 26, and is connected to one semiconductor area 31 of the transfer MISFET Qt2 through the n⁺type semiconductor area 28 interposed therein. The connection hole 26 is formed on the gate insulation film 25. The semiconductor area 28 is constituted by the n type impurity diffused from the polycrystalline silicon film 27A of the lower layer of the gate electrode 27 through the connection hole 26 onto the main surface portion of the well area 22.

The other extending end of the gate electrode 27 of the drive MISFET Qd2 passes through the connection hole 26, and is connected to the semiconductor area 31 which is the drain area of the drive MISFET Qd1 through the n⁺type semiconductor area 28 interposed therein. The semiconductor area 31 being the drain area of the drive MISFET Qd2 and one semiconductor area 31 of the transfer MISFET Qt2 are constituted integrally.

A data line (DL) 40 is connected to respective other semiconductor areas 31 of the transfer MISFETs Qt1, Qt2 through a connection hole 39 formed on an interlayer insulation film 38. The data line 40 extends in the column direction on an upper side of the interlayer insulation film 38. The data line 40 is constituted, for example, by an aluminium film or an aluminium alloy film to which Cu or Si is added so as to prevent the migration.

The reference voltage Vss is applied to the semiconductor area 31 corresponding to the respective source areas of the drive MISFETs Qd1, Qd2. Supply of the reference voltage Vss is effected by reference voltage wiring which is formed by the same conduction layer as the gate electrode 27 and the word line 27, i.e., a composite film comprising the polycrystalline silicon film 27A and the high melting-point metal silicide film 27B, and extends in the same row direction. The reference voltage wiring is connected through the connection hole 26 formed on the gate insulation film 25 to the semiconductor area 31 corresponding to the respective source areas of the drive MISFETs Qd1, Qd2.

The load MISFET Qp1 of the memory cell is constituted on an upper side of (i.e., insulatedly above) the drive MISFET Qd2. The load MISFET Qp2 is constituted on an upper side of (i.e., insulatedly above) the drive MISFET Qd1. That is, respective load MISFETs QP1, Qp2 are mainly composed of a gate electrode 34, a gate insulation film 35, a channel forming area 37A, a drain area 37B and a source area 37C.

Figure 7:
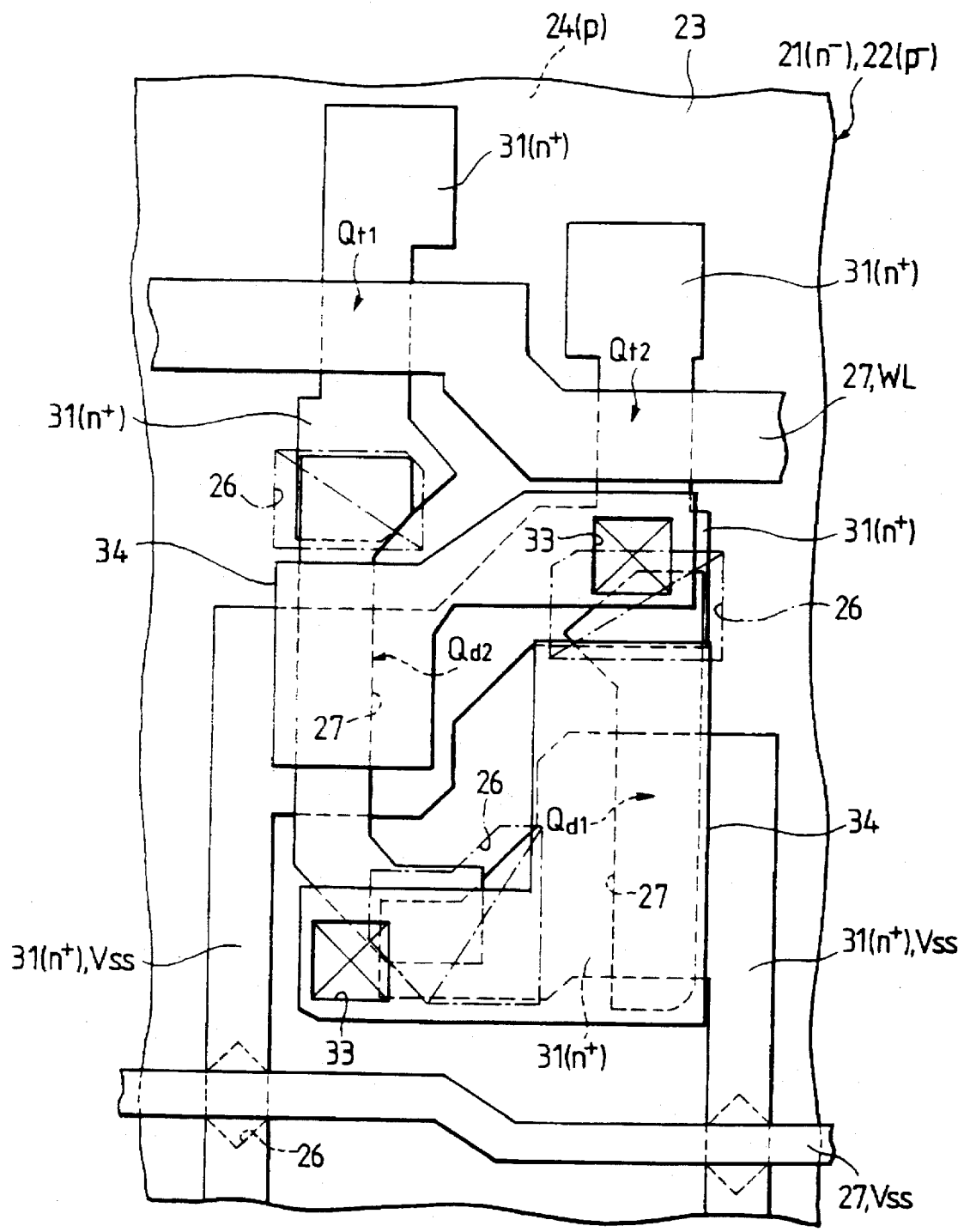

As shown in FIG. 7 (plan view in the prescribed manufacturing process) in detail, the gate electrode 34 of the load MISFET Qp1 is constituted on an upper side of the gate electrode 27 of the drive MISFET Qd2 so as to cover it. The interlayer insulation film 32 is provided between the gate electrode 34 and the gate electrode 27. The gate electrode 34 of the load MISFET Qp1 is connected through the connection hole 33 formed on the interlayer film 32 to the upper surface of the high melting-point metal silicide film 27B of the gate electrode 27 of the drive MISFET Qd1. Consequently, the gate electrode 34 of the load MISFET Qp1 is connected to the semiconductor area 31 corresponding to the drain area of the drive MISFET Qd2 through the gate electrode 27 interposed therein. Also the gate electrode 34 of the load MISFET Qp2 is constituted on an upper side of the gate electrode 27 of the drive MISFET Qd1 so as to cover it. The gate electrode 34 of the load MISFET Qp2 is connected through the connection hole 33 to sur face of the high melting-point metal silicide film 27B of gate electrode 27 of the drive MISFET Qd2. Consequently, the gate electrode 34 of the load MISFET Qp2 is connected to the semiconductor area 31 corresponding to the drain area of the drive MISFET Qd1 which is integrally formed with one semiconductor area 31 of the transfer MISFET Qt1.

The gate electrode 34 is constituted by a polycrystalline silicon film in which impurity is introduced so as to reduce the resistance value. P type impurity (B) is introduced in the polycrystalline silicon film. The gate electrode 34 is constituted by the polycrystalline silicon film with the p type impurity (B) introduced therein, and connected to the semiconductor area 31 or the gate electrode 27 through the high melting-point metal silicide film 27B interposed therein in order to prevent insertion of a parasitic diode. The gate electrode 34 comprising the polycrystalline silicon film with the p type impurity introduced therein can decrease the threshold voltage of respective load MISFETs Qp1, Qp2 in comparison to the case of the n type gate electrode. The decrease of the threshold voltage can decrease the introduction quantity of the impurity introduced in the channel forming area 37A of the respective load MISFETs Qp1, Qp2, thereby making the introduction quantity of the impurity more controllable.

When the n type impurity (As or P) is introduced in the gate electrode 34, the ohmic characteristics cannot be deteriorated during the connection to respective gate electrodes 27 of the drive MISFETs Qd1, Qd2 or the n type semiconductor area 31.

As a result of the basic study by the inventors, an effect has been confirmed in that when the gate electrode 34 is formed in film thickness of about 1000(A) or more, a depletion layer is formed within the gate electrode 34 (polycrystalline silicon film) by the field effect from the gate electrode 27 of the drive MISFET Qd1 or Qd2, thereby the field effect from the gate electrode 27 can be shielded by the gate electrode 34. Consequently, the gate electrode 34 is constituted in the above-mentioned film thickness.

The gate electrode 34 is not limited to the polycrystalline silicon film but may be constituted by a single layer of a high melting-point metal silicide film or a high melting-point metal film. In this case, the conductivity type of the conductive layer connected to the gate electrode 34 has no relation. Also the gate electrode 34 may be a composite film comprising a polycrystalline silicon film, and a high melting-point metal silicide film or a high melting-point metal film on the polycrystalline silicon film.

Capacitance $C_5$ using the interlayer insulation film 32 as a dielectric layer is formed between the gate electrode 27 of the drive MISFETs Qd2, Qd1 and the gate electrode 34 of the load MISFETs Qp1, Qp2.

The capacitance $C_5$ has effect of increasing the capacitance of the storage node portions N1, N2 of the flip-flop circuit, as shown in FIG. 5.

The gate insulation film 35 is constituted by a silicon oxide film deposited by means of CVD.

Figure 8:
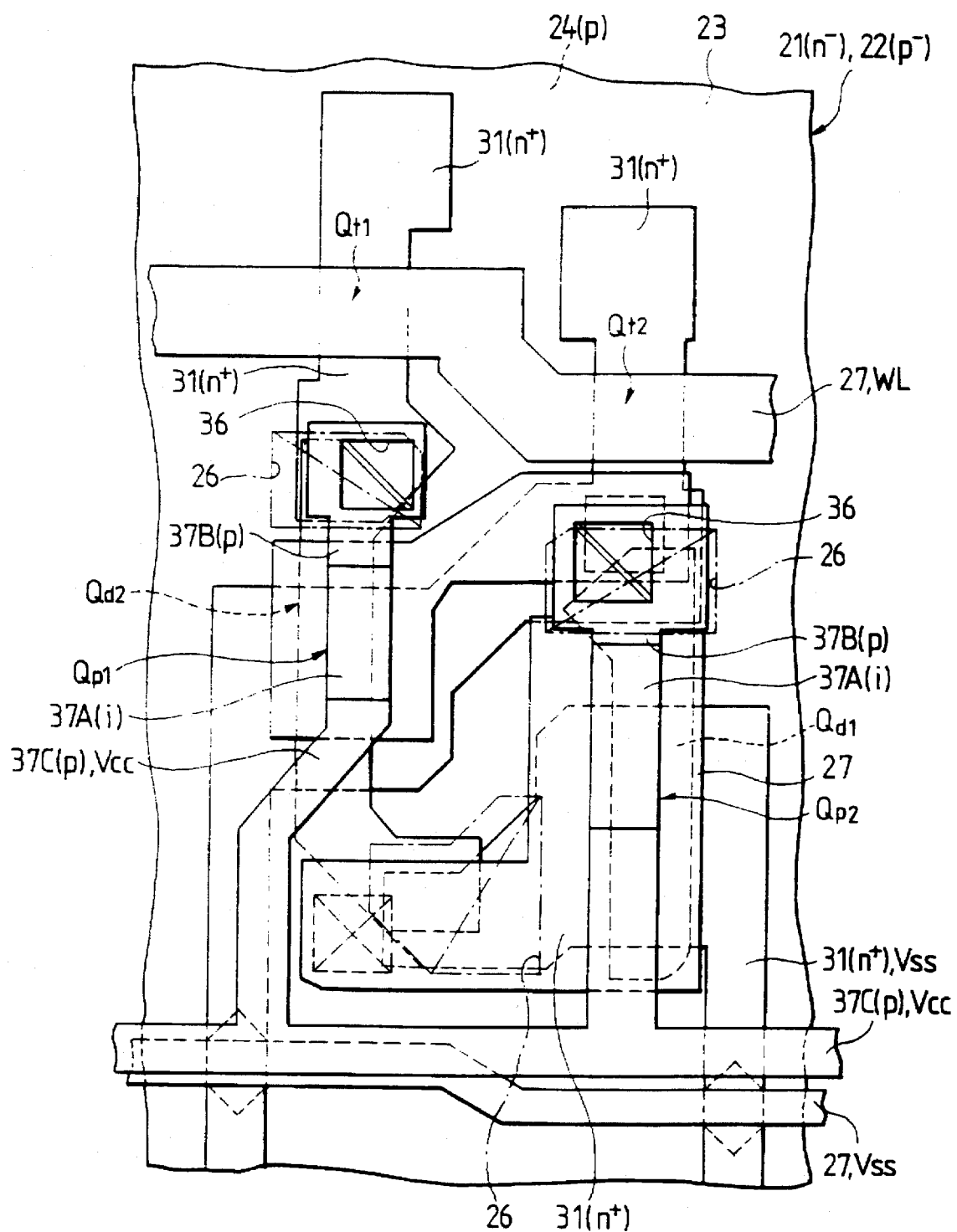

The channel forming area 37A, as shown in FIG. 8 (plan view in the prescribed manufacturing process) in detail, is formed on prescribed upper portion of the gate insulation film 35. The channel forming area 37A is constituted by a polycrystalline silicon film of i type where impurity to reduce the resistance value is not introduced or p type impurity is slightly introduced.

The drain area 37B is formed integrally with one end side of the channel forming area 37A, and is constituted by a p type polycrystalline silicon film in which p type impurity is introduced. The drain area 37B is connected through the connection hole 36 formed on the gate insulation film 35 (Part except for the channel forming area 37A is used as an interlayer insulation film) to gate electrode 27. Since the drain area 37B and the gate electrode 27 are connected through the high melting-point metal silicide layer, the drain area 37B and the gate electrode 27 can be connected in the ohmic connection.

The source area 37C is formed integrally with the other end side of the channel forming area 37A, and is constituted by a p type polycrystalline silicon film in which p type impurity is introduced. The source area 37C is formed integrally with the power source voltage wiring Vcc extending in the row direction.

As shown in FIG. 3, the gate electrode 34 of the load MISFET Qp1 is formed to be overlapped positively with the source area 37C and the drain area 37B. According to such overlapping, capacitance $C_3$ is provided between gate and source of the load MISFET Qp1, and capacitance $C_1$ is provided between gate and drain thereof. Also capacitance $C_4$ is provided between gate and source of the load MISFET Qp2, and capacitance $C_2$ is provided between gate and drain thereof. These capacitances $C_1$–$C_4$ are equivalently connected to the information storage nodes N1, N2 thereby the capacitance provided in the information storage nodes can be increased. Consequently, the effect that is obtained is that soft error due to s-ray or the like is not easily generated.

In the SRAM having memory cells of the CMOS type, the gate electrode 34 of the load MISFET Qp in such a memory cell is provided on the upper side of the gate electrode 27 of the drive MISFET Qd (i.e., it is insulatedly disposed thereover), thereby the field effect from the gate electrode 27 of the drive MISFET Qd can be shielded. Consequently, current amount during operating and current amount during the waiting, or quiescent period, respectively, of the load MISFET Qp can be optimized independently.

Gate electrodes of the load MISFET and the drive MISFET may be made independent thereby the degree of freedom in the layout can be increased.

Since the gate electrode of the transfer MISFET can be constituted by employing a material of low resistance having a high melting-point silicide layer, the read/write operation of information can be effected at high speed.

Further, since capacitance provided in the information storage node of the memory cell can be increased, the storage quantity of the information storage member can be increased and the soft error can be prevented.

Next, the manufacturing method of the memory cell of SRAM will be briefly described referring to FIGS. 9 through 15 (main part sectional view shown in each manufacturing process).

First, n⁻type semiconductor substrate 21 comprising monocrystalline silicon is prepared.

Next, in a memory cell forming area and n-channel MISFET forming area of a peripheral circuit (not shown) respectively, p⁻type well area 22 is formed on main surface portion of the semiconductor substrate 21.

Between elements of the memory cell, a field insulation film 23 and p type channel stopper area 24 are formed on main surface of the well area 22.

As shown in FIG. 9, between element forming areas of the memory cell, a gate insulation film 25 is formed on main surface of the well area 22. The gate insulation film 25 is constituted by a silicon oxide film formed by oxidizing the main surface of the well area 22. The gate insulation film 25 is formed in film thickness of about 250–350 (Å) for example.

As shown in FIG. 10, a connection hole 26 is formed. The connection hole 26 may be formed by partially removing the gate insulation film 25 in portion where a gate electrode 27 is connected directly to main surface of the well area 22.

Figure 11:
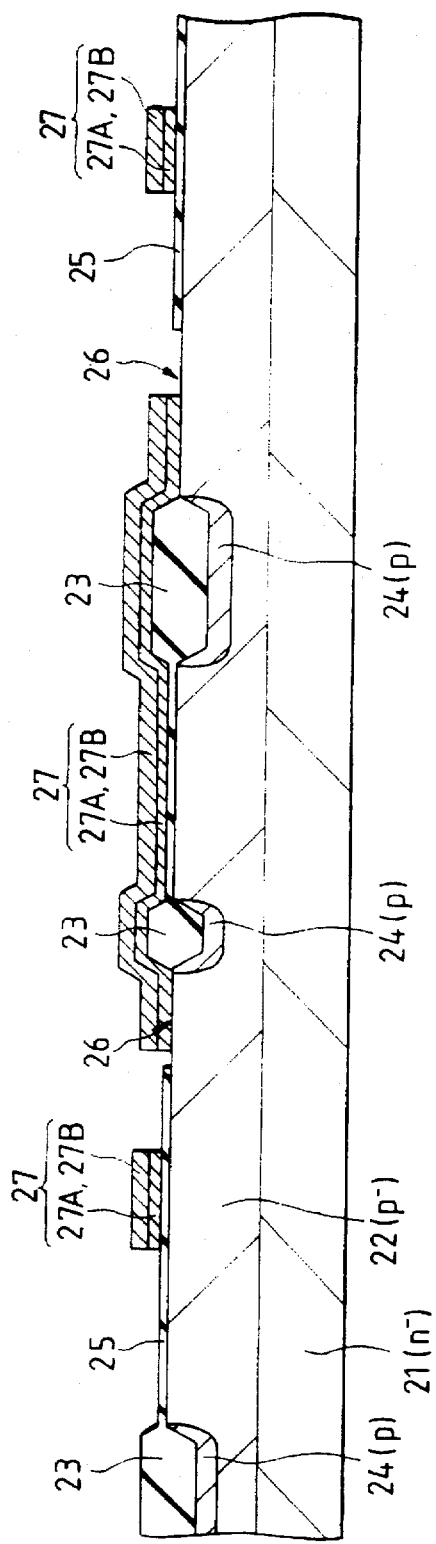

As shown in FIG. 11, a gate electrode 27, a word line 27 and a reference voltage wiring are formed. The gate electrode 27 is formed by a composite film comprising a polycrystalline silicon film 27A, and a high melting-point metal silicide film 27B stacked on upper side of the silicon film 27A. The polycrystalline film 27A is deposited by means of CVD, and P being n type impurity to reduce the resistance value is introduced therein. The polycrystalline silicon film 27A is formed in film thickness of about 2000–3000(Å) for example. The high melting-point metal silicide film 27B is deposited by means of sputtering. The high melting-point metal silicide film 27B is formed in film thickness of about 2500–3500(Å) for example. The polycrystalline silicon film 27A and the high melting-point metal silicide film 27B are subjected to patterning by anisotropy etching of RIE or the like.

Figure 12:
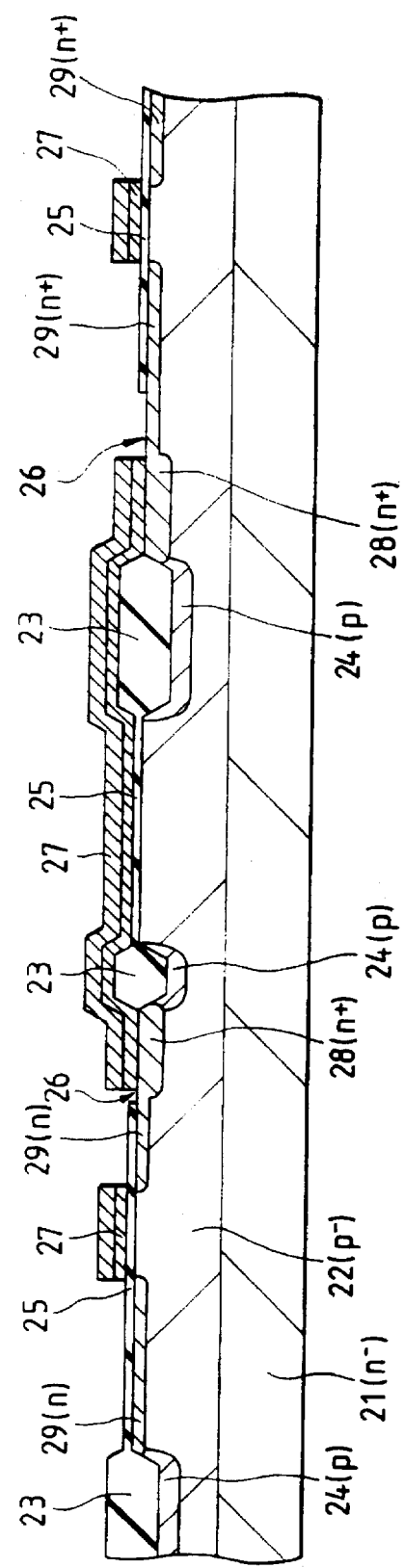

As shown in FIG. 12 n type semiconductor area 29 to be used as source area and a part drain area is formed. The semiconductor area 29 can be formed, for example, in that P of about $10^{13}$ (atoms/cm²) is introduced by ion implantation of energy of about 40–60 (KeV). In the introduction of the impurity, the gate electrode 27 and the field insulation film 23 are mainly used as an impurity introducing mask. Consequently, the semiconductor area 29 can be formed in self matching to the gate electrode 27.

Also as shown in FIG. 12, n⁺type semiconductor area 28 is formed on main surface portion of the well area 22 where the gate electrode 27 is connected through the connection hole 26. The semiconductor area 28 can be formed in that n type impurity introduced in the polycrystalline silicon film 27A being a lower layer of the gate electrode 27 is subjected to thermal diffusion on the main surface portion of the well area 22. The semiconductor area 28 is formed in the same process as the heat treatment process where, for example, the high melting-point metal silicide film 27B being an upper layer of the gate electrode 27 is activated.

Next, a side wall spacer 30 is formed on a side wall of the gate electrode 27. The side wall spacer 30 can be formed in that a silicon oxide film is deposited by means of CVD so as to cover the gate electrode 27, and anisotropy etching of RIE or the like is applied to the silicon oxide film.

As shown in FIG. 13, n⁺type semiconductor area 31 to be used as source area and drain area is formed. The semiconductor area 31 can be formed, for example, in that As of about $10^{15}$–$10^{16}$ (atoms/cm²) is introduced by ion implantation of energy of about 40–60 (KeV). In the introduction of the impurity, the gate electrode 27, the field insulation film 23 and the side wall spacer 30 are mainly used as an impurity introducing mask. Consequently, the semiconductor area 31 can be formed in self matching to the side wall spacer 30. Since the semiconductor area 31 is formed, the transfer MISFETs Qt1, Qt2 and the drive MISFETs Qd1, Qd2 are completed respectively.

Although not shown, p⁺type semiconductor area being source area and drain area of p-channel MISFET to constitute a peripheral circuit is formed after the process to form the semiconductor area 31.

Next, an interlayer insulation film 32 is formed on the whole surface of the substrate including upper side of the gate electrode 27. The interlayer insulation film 32 is formed by a silicon oxide film deposited by CVD and having fine film property. The interlayer insulation film 32 is formed in film thickness as thin as about 300–1500 (Å) so that the growth of stepped form is relieved and the step coverage of the conductive layer of the upper layer can be improved.

In the connecting portion between the gate electrode 27 and the gate electrode 34, the interlayer insulation film 32 is partially removed and a connection hole 33 is formed.

As shown in FIG. 14 respective gate electrode 34 of the load MISFETs QP10 QP2 to be connected to the gate electrode 27 through the connection hole 33 are formed. The gate electrode 34 is constituted by a polycrystalline silicon film deposited by means of CVD. The gate electrode 34 is formed in film thickness as thin as about 1000–1500(Å) for example. P of about $10^{15}$–$10^{16}$ (atoms/cm²) is introduced into the gate electrode 34 by ion implantation of energy of about 20–40 (KeV). That is, the gate electrode 34 is formed by the polycrystalline silicon film of n type.

Next, a gate insulation film 35 is formed on the whole surface of the substrate so as to cover the gate electrode 34. The gate insulation film 35 is formed, for example, by a silicon oxide film deposited by CVD and having fine film property. The gate insulation film 35 is formed in film thickness of about 1000–1500(Å) for example.

As shown in FIG. 15, on upper side of the gate insulation film 35, respective channel forming areas 37A of the load MISFETs Qp1, QP2, drain area 37B and source area 37C (including the power source voltage wiring) are formed in sequence. The channel forming area 37A, the drain area 37B and the source area 37C is constituted by a polycrystalline silicon film deposited by CVD for example, and formed in film thickness of about 650–2000(Å). The drain area 37B and the source area 37C are formed in p type, for example, in that BF₂ of about $10^{15}$ (atoms/cm²) is introduced into the polycrystalline silicon film by ion implantation of energy of about 50–70 (KeV). Since the channel forming area 37A, the drain area 37B and the source area 37C are formed, the load MISFETs QP1 and QP2 are completed.

Next an interlayer insulation film 38 is formed on the whole surface of the substrate. The interlayer insulation film 38 is constituted, for example, by a composite film comprising a silicon oxide film deposited by CVD and a PSG film formed on upper side of the silicon oxide film by CVD. And then a connection hole 39 is formed on the interlayer insulation film 38.

Next, as shown in FIGS. 3 and 4, a data line 40 is formed on upper side of the interlayer insulation film 38 so that connection is effected to respective other semiconductor areas 31 of the transfer MISFETs Qt1, Qt2 through the connection hole 39.

These series of the manufacturing processes are applied thereby the memory cell of SRAM of the embodiment is completed.

FIG. 16 shows an example where in the structure of the embodiment of the invention shown in FIG. 3, the conductive layer to constitute gate electrodes of the drive MISFETs Qd1, Qd2 and the transfer MISFETs Qt1, Qt2 is made of a structure of three layers, a polycrystalline silicon film, TiN and a high melting-point metal silicide layer in the order from the lower layer.

Since the gate electrode 27 of the drive MISFETs Qd1, Qd2 is N type, and the gate electrode 34 of the load MISFETs QP1, Qp2 and the source-drain area 37B, 37C are P type, if both are connected directly, the impurities will be mutually diffused. However, the above-mentioned structure shown in FIG. 16 can prevent the mutual diffusion of the impurities. Further, if a barrier layer of TiN is interposed between the polycrystalline silicon film and the high melting-point metal silicide layer, such problem in which the high melting-point metal passes through the polycrystalline silicon film and enters the gate insulation film under the polycrystalline silicon film which deteriorates the withstanding voltage of the gate insulating film is prevented. Of course, this structure of the gate electrodes may be applied to other examples of the invention.

Figure 19:
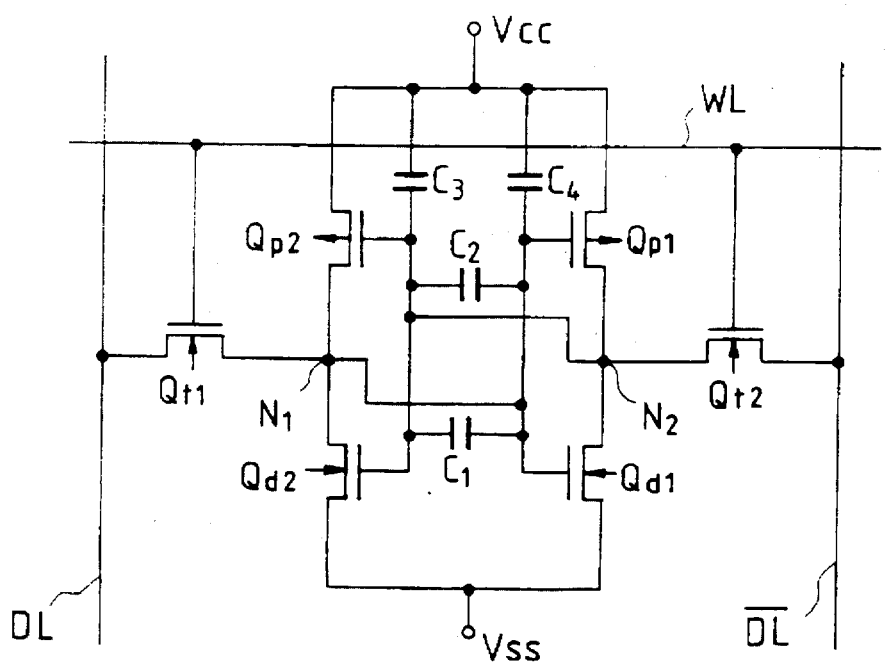
FIGS. 17 through 19 are diagrams illustrating a second embodiment of the invention.
Figure 17:
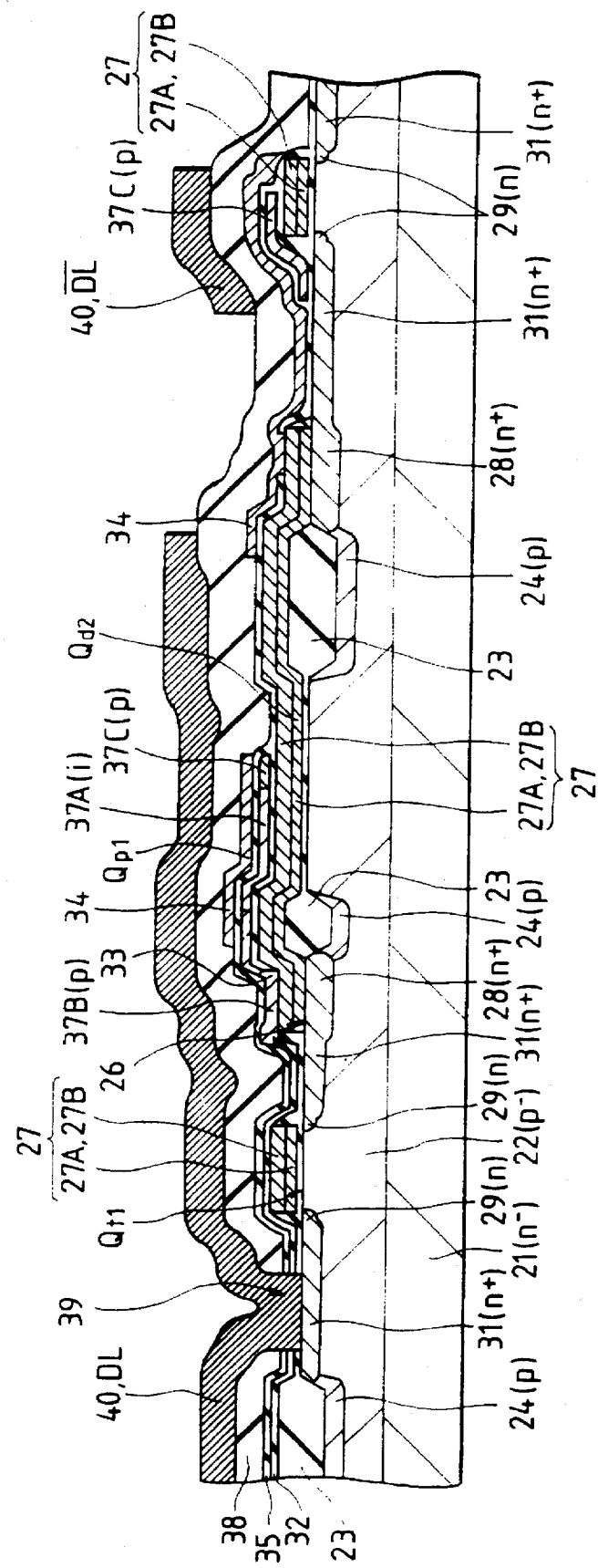
Figure 18:
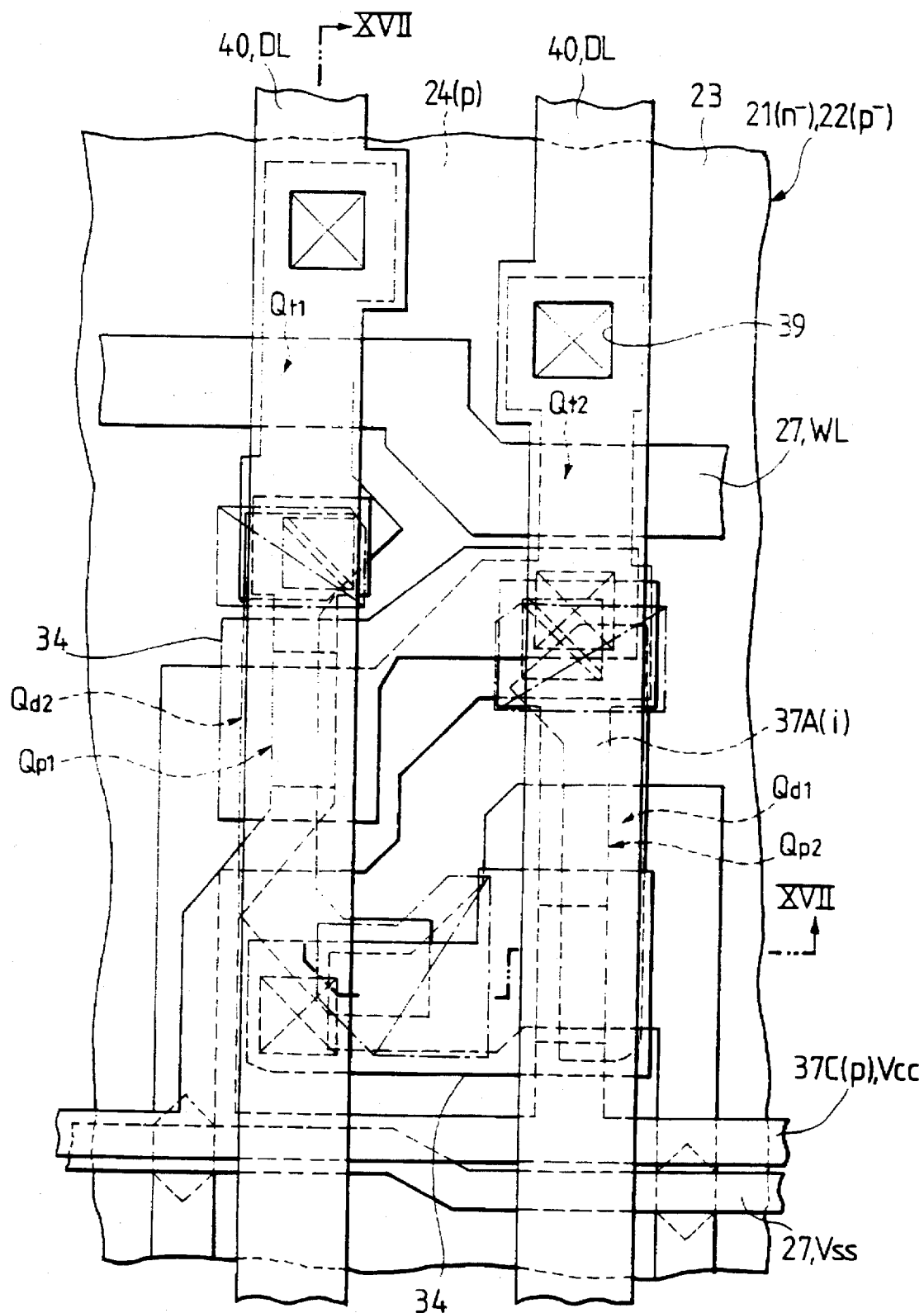

FIG. 17 shows an example where the gate electrode of the load MISFETs Qp1, QP2 is provided on upper side of area of source, drain and channel and is a sectional view taken in cutting line XVII—XVII of FIG. 18. Also FIG. 19 is an equivalent circuit diagram of the memory cell shown in FIG. 18. Reference numerals of parts in FIGS. 17–19 are the same as those in FIGS. 3–5. This embodiment is different from the previous embodiment in that the gate electrode of the load MISFETs Qp1, Qp2 is provided on upper side of area of source, drain and channel. That is, the area of source, drain and channel of the load MISFETs QP1, Qp2 is formed by the polycrystalline silicon layer being the second layer, and the gate electrode is formed by the polycrystalline silicon layer being the third layer.

Further, area of source and drain of the load MISFETs Qp1, Qp2 is an impurity area in which boron is introduced. The boron is introduced using the gate electrode 34 as a mask and then annealed so that the gate electrode and the impurity area are overlapped. It follows that the capacitance due to the overlapping between the gate electrode and the area of source and drain is connected as in C1–C4 of FIG. 19. As a result, capacitance to be added to the information storage nodes can be increased.

Figure 20:
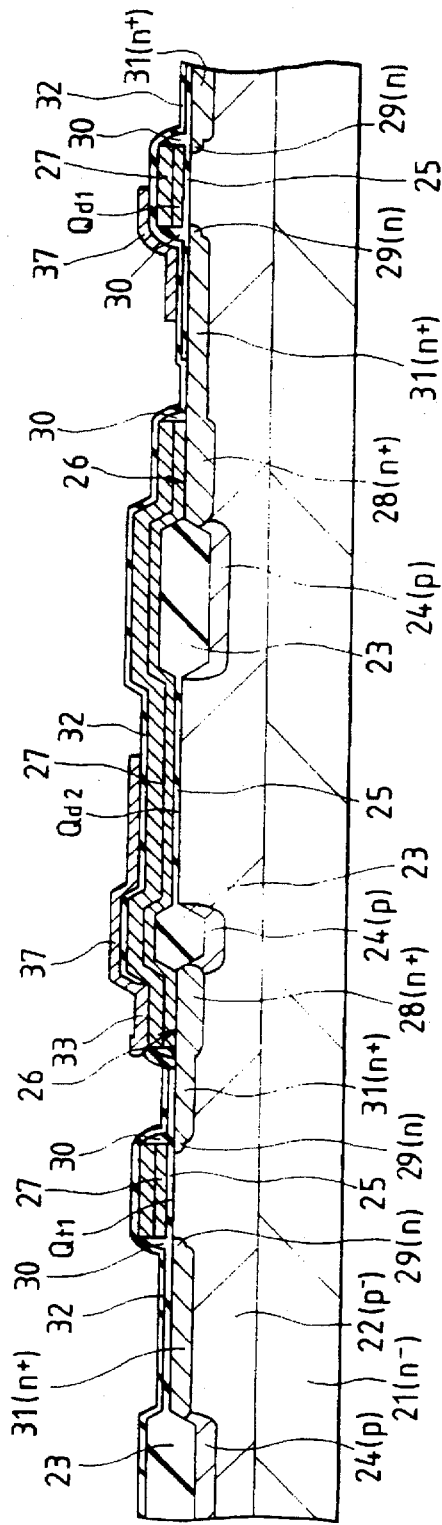
FIGS. 20 and 21 are sectional views illustrating the manufacturing method of the second embodiment of the invention.
Figure 21:
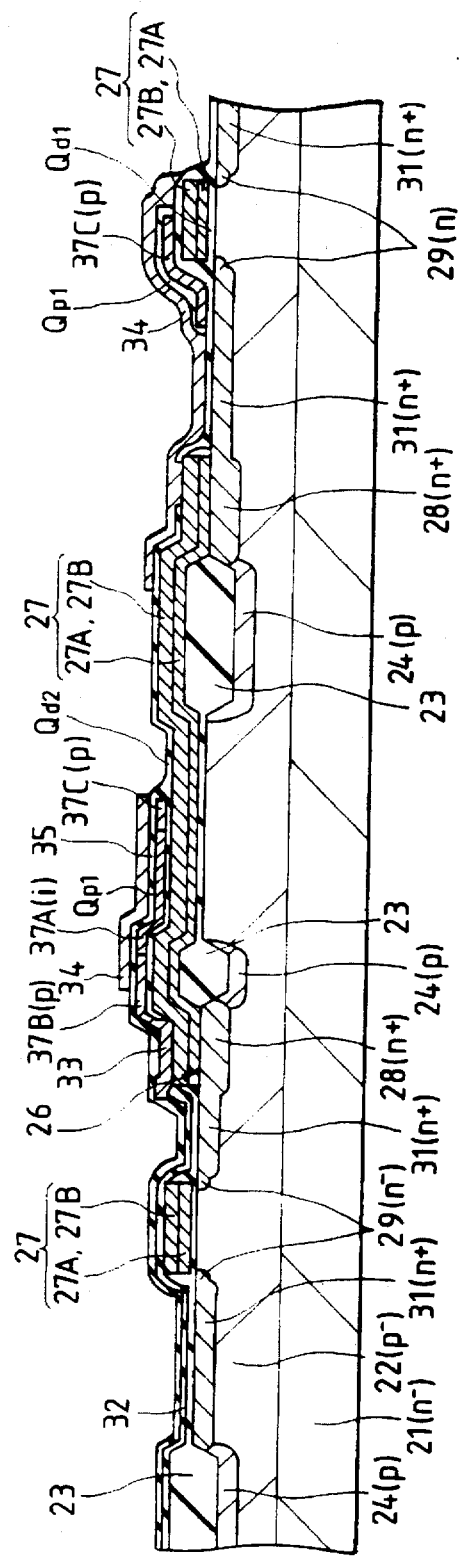

FIGS. 20 and 21 are views illustrating the manufacturing method of the memory cell shown in FIGS. 17–19. In similar manner to that in FIGS. 9–14, the polycrystalline silicon films in the first layer and the second layer are formed. However, plane pattern of the polycrystalline silicon film in the second layer is different from that in FIG. 14.

As shown in FIG. 20, the polycrystalline silicon film 37 deposited by CVD for example is formed in film thickness of 650–2000(Å), and then, as shown in FIG. 21, the gate insulation film 35 is formed in film thickness of about 200–400(Å) for example. Further, the polycrystalline silicon film 34 is formed in film thickness of 100–1500(Å) onto the gate insulation film 35 by CVD. The polycrystalline silicon film 34 is subjected to patterning as shown in FIG. 18. And then, ion implantation of BF2 of about $10^{15}$(atoms/cm$^2$) is effected in energy of about 50–70 (KeV) onto the gate electrode and the area of source and drain of the load MISFETs QP1, QP2, and annealing of 850°–950° C. is effected thereby the boron implanted into the polycrystalline silicon film 37 is diffused in the lateral direction. Consequently the overlapping capacitance is formed between the area of source and drain and the gate electrode.

The gate electrode is used as the mask in the ion implantation for forming the area of source and drain as above described, thereby the area of source and drain can be formed in self matching to the gate electrode, and further the manufacturing process can be simplified.

Figure 22:
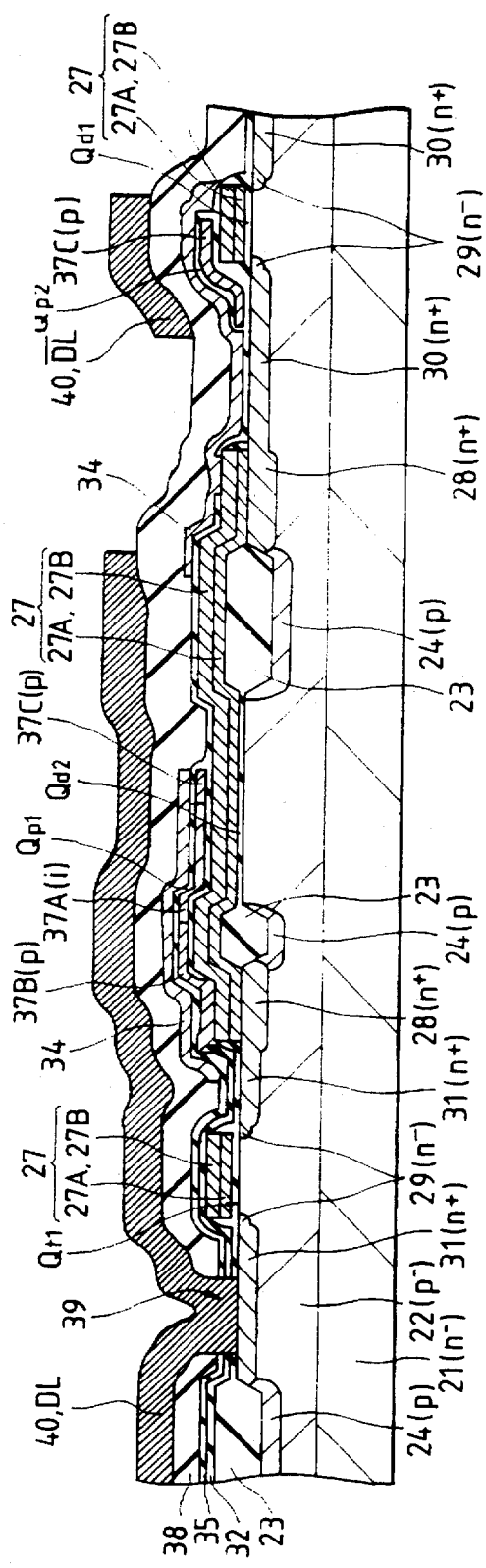
FIGS. 22 and 23 are a sectional view and a plan view, respectively, illustrating a third embodiment of the invention.
Figure 23:
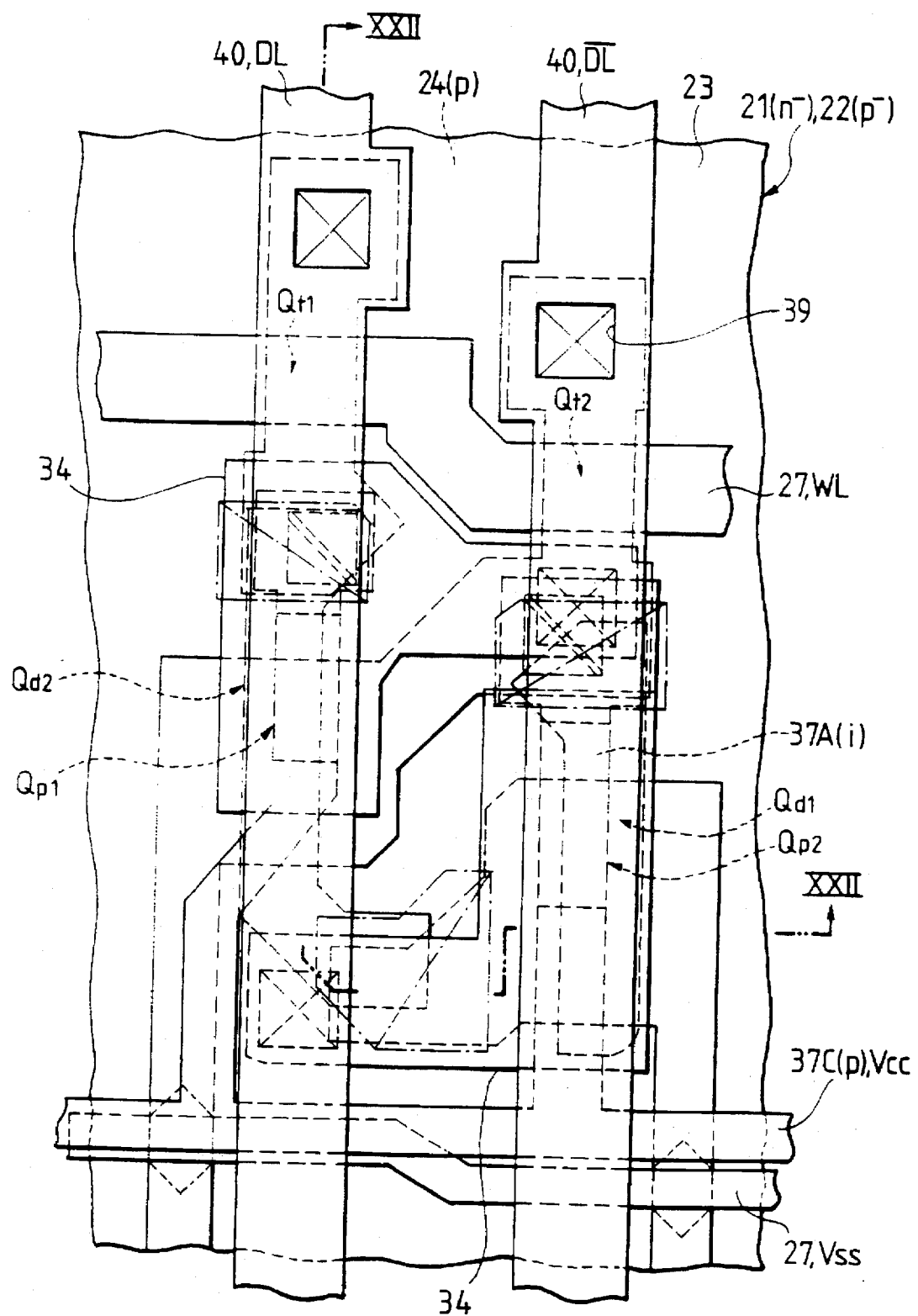

An example shown in FIGS. 22 and 23 is nearly similar to the example shown in FIGS. 17–19, but different in the plane pattern of the gate electrode 34 of the load MISFETs QP1, Qp2. FIG. 22 is a sectional view taken in cutting line XXII—XXII of FIG. 23. In this example, the gate electrode 34 of the load MISFETs QP1, Qp2 is widely overlapped with the area of source and drain. The gate electrode 34 is overlapped with the area of source and drain as above described, thereby the capacitance of C1–C4 of FIG. 19 can be increased.

In this case, however, since the gate electrode of the load MISFET cannot be made a mask in the ion implantation for forming the area of source and drain as described in FIG. 21, the manufacturing process number is increased corresponding to this.

Figure 24:
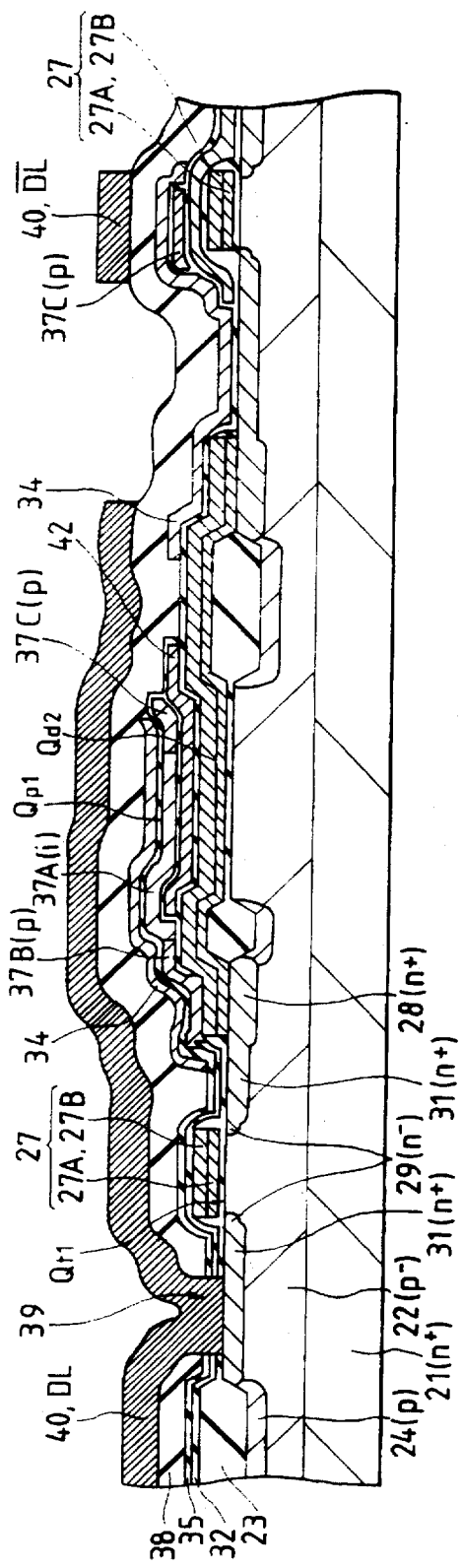
FIGS. 24 and 25 are a plan view and a sectional view illustrating a fourth modification of the invention.
Figure 25:
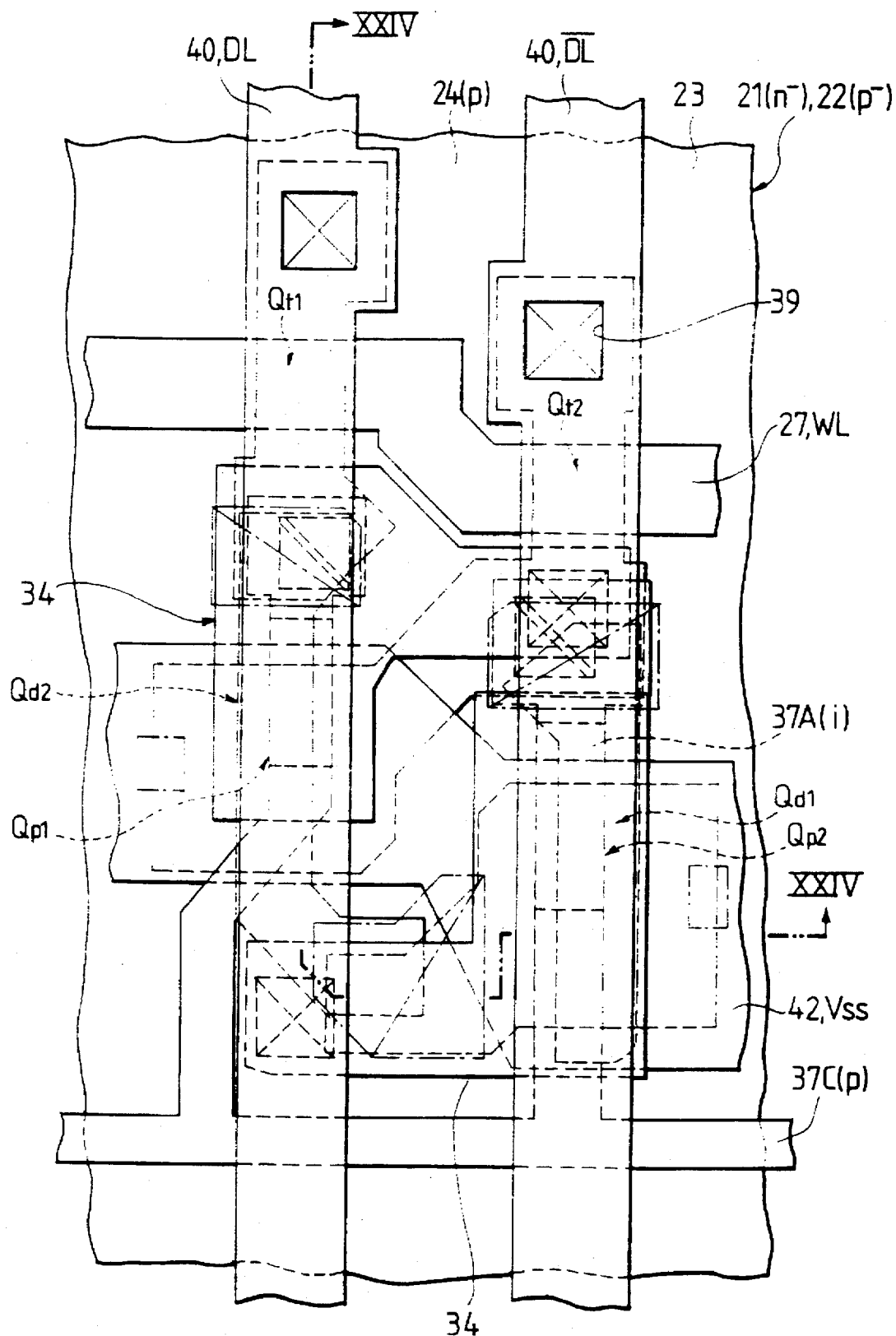

FIGS. 24 and 25 show an example where the polycrystalline silicon film in the second layer is used as a reference voltage wiring. FIG. 24 is a sectional view taken in cutting line XXIV—XXIV of FIG. 25.

A reference voltage wiring 42 constituted by the polycrystalline silicon film in the second layer is formed on the gate electrode 27 of the drive. MISFETs Qd1, Qd2 as shown in FIG. 25. The reference voltage wiring 42 is arranged between the gate electrode 27 of the drive MISFETs Qd1, Qd2 and the channel area 37A(i) of the load MISFETs QP1, QP2, and extends in the parallel direction to the word line.

According to this constitution, the field effect to the load MISFET from the gate electrode 27 of the drive MISFETs Qd1, Qd2 can be shielded. Consequently, it can be prevented that the field effect of the gate electrode of the drive MISFETs Qd1, Qd2 varies the current amount of the load MISFET in the operating state and the waiting state.

Further, since the reference voltage wiring 42 can be formed on the forming area of the drive MISFETs Qd1, Qd2, the memory cell area can be made small.

What is claimed is:

1. A method of manufacturing memory cells, each of said memory cells including cross-coupled first and a second inverter circuit, said first inverter circuit including a first drive MISFET and a first load MISFET coupled in series, and said second inverter circuit including a second drive MISFET and a second load MISFET coupled in series, said method comprising the steps of:

forming said drive MISFETs each having a source region and a drain region both of n-type conductivity formed in a semiconductor substrate, a gate insulating film formed over a main surface of said semiconductor substrate, and a gate electrode formed over said gate insulating film;

forming a first insulating film over the gate electrodes of said drive MISFETs so as to cover said main surface;

forming first polycrystalline silicon films over said first insulating film, wherein each of said first polycrystalline silicon films formed serves as a gate electrode of a load MISFET and is patterned to effect electrical connections in such a manner that the gate electrodes of said first and second load MISFETs, in each memory cell, are electrically connected to the drain regions of said second and first drive MISFETs, respectively; and forming second polycrystalline silicon films over said first insulating film, wherein each of said second polycrystalline silicon films serves as a drain region of p-type conductivity and a source region of a load MISFET and is patterned to effect electrical connections, in each memory cell, in such a manner that the drain region of one of said first and second load MISFETs is electrically connected to the drain region of the drive MISFET corresponding to the same inverter circuit through a first polycrystalline silicon film corresponding to the gate electrode of the other one of said first and second load MISFETs.

2. A method of manufacturing memory cells according to claim 1, wherein said second polycrystalline silicon films are formed over said first polycrystalline silicon films, and wherein a gate insulating film of each said load MISFET is formed between said gate electrode thereof and a channel forming region thereof, respectively.

3. A method of manufacturing memory cells according to claim 2, wherein said load MISFETs and said drive MISFETs are formed to have p-channel type and n-channel type conductivity, respectively.

4. A method of manufacturing memory cells according to claim 3, wherein the step of forming the gate electrodes of said drive MISFETs includes forming a composite film layer comprising each of said first polycrystalline silicon films and a high melting-point silicide film of metal thereon, respectively.

5. A method of manufacturing memory cells according to claim 4, wherein the high melting-point silicide films of metal are formed to have a greater thickness than said first polycrystalline silicon films, respectively.

6. A method of manufacturing memory cells according to claim 5, wherein the step of forming the electrical connections between the drains of said first and second load MISFETs with the drains of said first and second drive MISFETs includes electrically connecting the drains of said first and second load MISFETs to said first polycrystalline silicon films associated with the gate electrodes of the second and first drive MISFETs through said silicide films, respectively.

7. A method of manufacturing memory cells according to claim 6, wherein the step of forming said load MISFETs further includes forming the gate electrodes thereof over said second polycrystalline silicon films.

8. A method of manufacturing memory cells according to claim 6, wherein the step of forming said load MISFETs further includes forming said second polycrystalline silicon films over the gate electrodes of said load MISFETs.

9. A method of manufacturing memory cells according to claim 8, wherein the step of forming said load MISFETs further includes forming the gate electrodes thereof over said second polycrystalline silicon films.

10. A method of manufacturing memory cells according to claim 9, wherein the step of forming said load MISFETs further includes forming said second polycrystalline silicon films over the gate electrodes of said load MISFETs.

11. A method of manufacturing memory cells according to claim 10, wherein the step of forming said load MISFETs further includes forming the gate electrodes thereof by depositing an n-type impurity in third polycrystalline silicon films.

12. A method of manufacturing memory cells according to claim 3, wherein the gate electrodes of said drive MISFETs are formed to have an n-type conductivity, and wherein said first polycrystalline silicon films are formed to be electrically connected to the gate electrodes of said drive MISFETs.

13. A method of manufacturing memory cells according to claim 3, wherein said first polycrystalline silicon films have an n-type conductivity, respectively.

14. A method of manufacturing memory cells according to claim 1, wherein said first polycrystalline silicon films have an n-type conductivity, respectively.

15. A method of manufacturing memory cells according to claim 9, wherein the gate electrodes of load MISFETs are formed to have an n-type conductivity.

16. A method of manufacturing memory cells according to claim 15, wherein said load MISFETs are formed to have a p-channel type conductivity and said drive MISFETs are formed to have an n-channel type conductivity.

17. A method of manufacturing memory cells according to claim 10, wherein the gate electrodes of said load MISFETs are formed to have an n-type conductivity, respectively, wherein the drain region of said first load MISFET is electrically connected to the gate electrode of said second load MISFET through the gate electrode of said second drive MISFET, and wherein the drain region of said second load MISFET is electrically connected to the gate electrode of said first drive MISFET through the gate electrode of said first load MISFET.

18. A method of manufacturing memory cells according to claim 10, wherein the gate electrodes of said first and second load MISFETs are formed to have a p-type conductivity and are electrically connected to the gate electrodes of said first and second drive MISFETs, respectively, wherein the drain region of said first load MISFET is electrically connected to the gate electrode of said second load MISFET through the gate electrode of said second drive MISFET, and wherein the drain region of said second load MISFET is electrically connected to the gate electrode of said first drive MISFET through the gate electrode of said first load MISFET.

19. A method of manufacturing memory cells according to claim 18, further comprising the steps of:

forming a wiring line electrically connected to the source regions of said drive MISFETs; and forming a second insulating film over said wiring line so as to cover said main surface, wherein said load MISFETs are formed above both said first and second insulating films.

20. A method of manufacturing memory cells according to claim 19, wherein the step of forming said load MISFETs further includes forming the gate electrodes thereof over said second polycrystalline silicon films.

21. A method of manufacturing memory cells according to claim 19, wherein the step of forming said load MISFETs further includes forming said second polycrystalline silicon films over the gate electrodes of said load MISFETs.

22. A method of manufacturing memory cells of a static random access memory, each of said memory cells including cross-coupled a first and a second inverter circuit, said first inverter circuit including a first drive MISFET and a first load MISFET coupled in series, and said second inverter circuit including a second drive MISFET and a second load MISFET coupled in series, said method comprising steps of:

forming said drive MISFETs each having a source and a drain region both of n-type conductivity formed in a semiconductor substrate, a gate insulating film formed over a main surface of said semiconductor substrate, and a gate electrode formed over said gate insulating film;

forming a first insulating film over said gate electrodes of drive MISFETs so as to cover said main surface;

forming a wiring line electrically connected to source regions of said drive MISFET;

forming a second insulating film over said wiring line so as to cover said main surface;

forming first polycrystalline silicon films of n-type conductivity at a higher level layer than that of said first and second insulating films, wherein each of said first polycrystalline silicon films formed serves as a gate electrode of a load MISFET and is patterned to effect electrical connections in such a manner that the gate electrodes of said first and second load MISFETs, in each memory cell, are electrically connected to the drain regions of said second and first drive MISFETs, respectively; and forming second polycrystalline silicon films over said second insulating film, wherein each of said second polycrystalline silicon films serves as a drain region of p-type conductivity and a source region of a load MISFET and is patterned to effect electrical connections, in each memory cell, in such a manner that the drain region of one of said first and second load MISFETs is electrically connected to the drain region of the drive MISFET corresponding to the same inverter circuit through a first polycrystalline silicon film corresponding to the gate electrode of the other one of said first and second load MISFETs.

23. A method of manufacturing memory cells according to claim 22, wherein the step of forming said load MISFETs further includes forming said second polycrystalline silicon films over said first polycrystalline silicon films.

24. A method of manufacturing memory cells according to claim 23, wherein said gate electrodes of drive MISFETs have n-type conductivity, and wherein said first polycrystalline silicon films are electrically connected to said gate electrodes of drive MISFETs.

25. A method of manufacturing memory cells according to claim 23, wherein said drive MISFETs and said load MISFETs are n-channel MISFETs and p-channel MISFETs, respectively.

26. A method of manufacturing memory cells according to claim 22, wherein the drain region of said other one of said first and second load MISFETs is electrically connected to the drain region of the drive MISFET of that inverter circuit through the gate electrode of the drive MISFET of the other inverter circuit.

27. A method of manufacturing memory cells according to claim 1, wherein the drain region of said other one of said first and second load MISFETs is electrically connected to the drain region of the drive MISFET of that inverter circuit through the gate electrode of the drive MISFET of the other inverter circuit.

28. A method of manufacturing memory cells according to claim 20, wherein said second insulating film is formed over said wiring line and said first insulating film so as to cover said main surface, and wherein said load MISFETs are formed over said second insulating film.

29. A method of manufacturing memory cells according to claim 19, wherein said second insulating film is formed over said wiring line and said first insulating film so as to cover said main surface, and wherein said load MISFETs are formed over said second insulating film.

30. A method of manufacturing memory cells according to claim 26, wherein said second insulating film is formed over said wiring line and said first insulating film so as to cover said main surface, and wherein said first polycrystalline silicon films are formed over said second insulating film.

31. A method of manufacturing memory cells according to claim 22, wherein said second insulating film is formed over said wiring line and said first insulating film so as to cover said main surface, and wherein said first polycrystalline silicon films are formed over said second insulating film.

* * * * *